(12) United States Patent
Do et al.

(10) Patent No.: US 10,832,988 B2
(45) Date of Patent: *Nov. 10, 2020

(54) INTEGRATED CIRCUIT HAVING CONTACT JUMPER

(71) Applicant: SAMSUNG ELECTRONICS CO., LTD., Suwon-si (KR)

(72) Inventors: Jung-Ho Do, Hwaseong-si (KR); Tae-Joong Song, Seongnam-si (KR); Seung-Young Lee, Seoul (KR); Jong-Hoon Jung, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/394,961

(22) Filed: Apr. 25, 2019

(65) Prior Publication Data

US 2019/0252297 A1 Aug. 15, 2019

Related U.S. Application Data

(63) Continuation of application No. 15/865,941, filed on Jan. 9, 2018, now Pat. No. 10,319,668.

(30) Foreign Application Priority Data

Feb. 8, 2017 (KR) .................. 10-2017-0017676
Jun. 28, 2017 (KR) .................. 10-2017-0081831

(51) Int. Cl.
*H01L 23/48* (2006.01)
*H01L 23/482* (2006.01)
*H01L 27/02* (2006.01)
*H01L 27/118* (2006.01)
*H01L 23/485* (2006.01)
(Continued)

(52) U.S. Cl.
CPC .......... *H01L 23/481* (2013.01); *G06F 30/394* (2020.01); *H01L 21/76895* (2013.01); *H01L 23/482* (2013.01); *H01L 23/485* (2013.01); *H01L 27/0207* (2013.01); *H01L 27/11807* (2013.01); *G06F 30/392* (2020.01); *H01L 2027/11875* (2013.01)

(58) Field of Classification Search
CPC . H01L 23/481; H01L 23/482; H01L 27/0207; G06F 17/5077
See application file for complete search history.

(56) References Cited

U.S. PATENT DOCUMENTS 7,745,867 B2    6/2010  Houston
8,217,469 B2    7/2012  Hou et al.
(Continued)

FOREIGN PATENT DOCUMENTS

KR    1020160021726    2/2016

*Primary Examiner* — David A Zarneke
(74) *Attorney, Agent, or Firm* — Volentine, Whitt & Francos, PLLC

(57) ABSTRACT

An integrated circuit includes first and second active regions extending in a first direction, a first gate line extending in a second direction substantially perpendicular to the first direction and crossing the first and second active regions, and a first contact jumper including a first conductive pattern intersecting the first gate line above the first active region and a second conductive pattern extending in the second direction above the first gate line and connected to the first conductive pattern.

20 Claims, 45 Drawing Sheets

(51) Int. Cl.
*H01L 21/768* (2006.01)
*G06F 30/394* (2020.01)
*G06F 30/392* (2020.01)

(56) References Cited

U.S. PATENT DOCUMENTS

| | | |
|---|---|---|
| 8,232,625 B2 | 7/2012 | Voldman |
| 8,884,349 B2 | 11/2014 | Miura |
| 9,337,099 B1 | 5/2016 | Jain et al. |
| 9,431,383 B2 | 8/2016 | Baek et al. |
| 10,319,668 B2 * | 6/2019 | Do ................... G06F 30/394 |
| 2008/0169487 A1 | 7/2008 | Shimbo et al. |
| 2013/0056875 A1 | 3/2013 | Nogami et al. |
| 2015/0008524 A1 | 1/2015 | Hung et al. |
| 2016/0049395 A1 | 2/2016 | Okagaki et al. |
| 2016/0064280 A1 | 3/2016 | Ookita et al. |
| 2018/0019736 A1 | 1/2018 | Kim et al. |

* cited by examiner $$C_{out} = (A*B*C_{in}) + (A*B*C_{in}) + (A*B*C_{in}) + (A*B*C_{in})$$
$$= (B*C_{in}) + (A*C_{in}) + (A*B)$$
$$SUM = (A*B*C_{in}) + (A*B*C_{in}) + (A*B*C_{in}) + (A*B*C_{in})$$

INTEGRATED CIRCUIT HAVING CONTACT JUMPER

PRIORITY STATEMENT

This is a Continuation of U.S. application Ser. No. 15/865,941, filed Jan. 9, 2018, which issued as U.S. Pat. No. 10,319,668 on Jun. 11, 2019, and which claims the benefits of Korean Patent Application No. 10-2017-0017676, filed on Feb. 8, 2017, and Korean Patent Application No. 10-2017-0081831, filed on Jun. 28, 2017, in the Korean Intellectual Property Office, the disclosures of which are hereby incorporated by reference in their entireties.

BACKGROUND

The inventive concept relates to integrated circuits, and more particularly, to a standard cell, a standard cell library including the standard cell, an integrated circuit, and a computer implementation method and computing system for designing integrated circuits.

An integrated circuit may be designed based on standard cells. Specifically, a layout of the integrated circuit may be generated by arranging standard cells defining the integrated circuit (standard cell "placement") and routing the standard cells. As the design rule for semiconductor processes becomes smaller, aspects of the layout such as the size of patterns may become smaller so that a design rule may be met. In particular, in an example of an integrated circuit including fins such as finFETs, the pitch of the fins may have to be reduced which in turn results in active regions in the standard cells having smaller footprints. Accordingly, the "heights" of the standard cells (a dimension of the standard cell in the layout) may be reduced.

SUMMARY

According to an aspect of the inventive concept, there is provided an integrated circuit including first and second active regions each extending in a first direction, a first gate line extending longitudinally across the first and second active regions in a second direction substantially perpendicular to the first direction, and a first contact jumper comprising a first conductive pattern crossing the first gate line above the first active region, and a second conductive pattern extending longitudinally in the second direction above the first gate line and connected to the first conductive pattern.

According to another aspect of the inventive concept, there is provided an integrated circuit including first and second active regions each extending in a first direction, first and second gate lines spaced from each other in the first direction, each of the first and second gate lines extending longitudinally across the first and second active regions in a second direction substantially perpendicular to the first direction, and a first contact jumper comprising a first conductive pattern crossing the first and second gate lines above the first active region and a second conductive pattern extending longitudinally in the second direction between the first and second gate lines as viewed in a plan view of the integrated circuit and connected to the first conductive pattern.

According to another aspect of the inventive concept, there is provided an integrated circuit including first and second active regions each extending in a first direction and spaced in a second direction substantially perpendicular to the first direction such that a middle region exists as interposed between the first and second active regions in the second direction, first and second gate lines spaced from each other in the first direction, each of the first and second gate lines extending longitudinally across the first and second active regions and the middle region in the second direction, a contact jumper comprising a first conductive pattern crossing the first gate line above the first active region and a second conductive pattern extending longitudinally in the second direction above the first gate line and connected to the first conductive pattern, first and second vias aligned with each other in the first direction in the middle region between the first and second active regions with the first via disposed on the second conductive pattern and the second via located above the second gate line, and a first metal layer comprising a first metal pattern extending in the first direction above the first active region, a second metal pattern extending in the first direction above the second active region, and a plurality of third metal patterns extending in the second direction in the middle region and respectively disposed on the first and second vias.

According to another aspect of the inventive concept, there is provided an integrated circuit including a substrate having first and second active regions each elongated in a first direction and spaced in a second direction substantially perpendicular to the first direction, and a middle region interposed between the first and second active regions in the second direction, gate lines spaced from each other in the first direction, each of the gate lines extending longitudinally across the first and second active regions and the middle region in the second direction, a layer of contacts on the substrate and having upper surfaces substantially coplanar at a level above the substrate, the layer of contacts including a contact jumper comprising a first conductive pattern elongated in the first direction and crossing at least one of the gate lines in the first direction above the first active region of the substrate, and a second conductive pattern extending from the first conductive pattern longitudinally in the second direction over at least part of the middle region of the substrate, a layer of vias on the layer of contacts, each of the vias extending on the upper surface of a respective one of the contacts, and the layer of vias including a plurality of vias disposed over the middle region of the substrate as aligned with each other in the first direction, and a first metallization layer on the layer of vias, and in which only one track of metal in the first metallization layer extends over the first active region, only one track of metal in the first metallization layer extends over the second active region, and each of the tracks of metal extends across the gate lines in the first direction.

BRIEF DESCRIPTION OF THE DRAWINGS

The inventive concept will be more clearly understood from the following detailed description of examples thereof taken in conjunction with the accompanying drawings in which.

DETAILED DESCRIPTION

Figure 1:
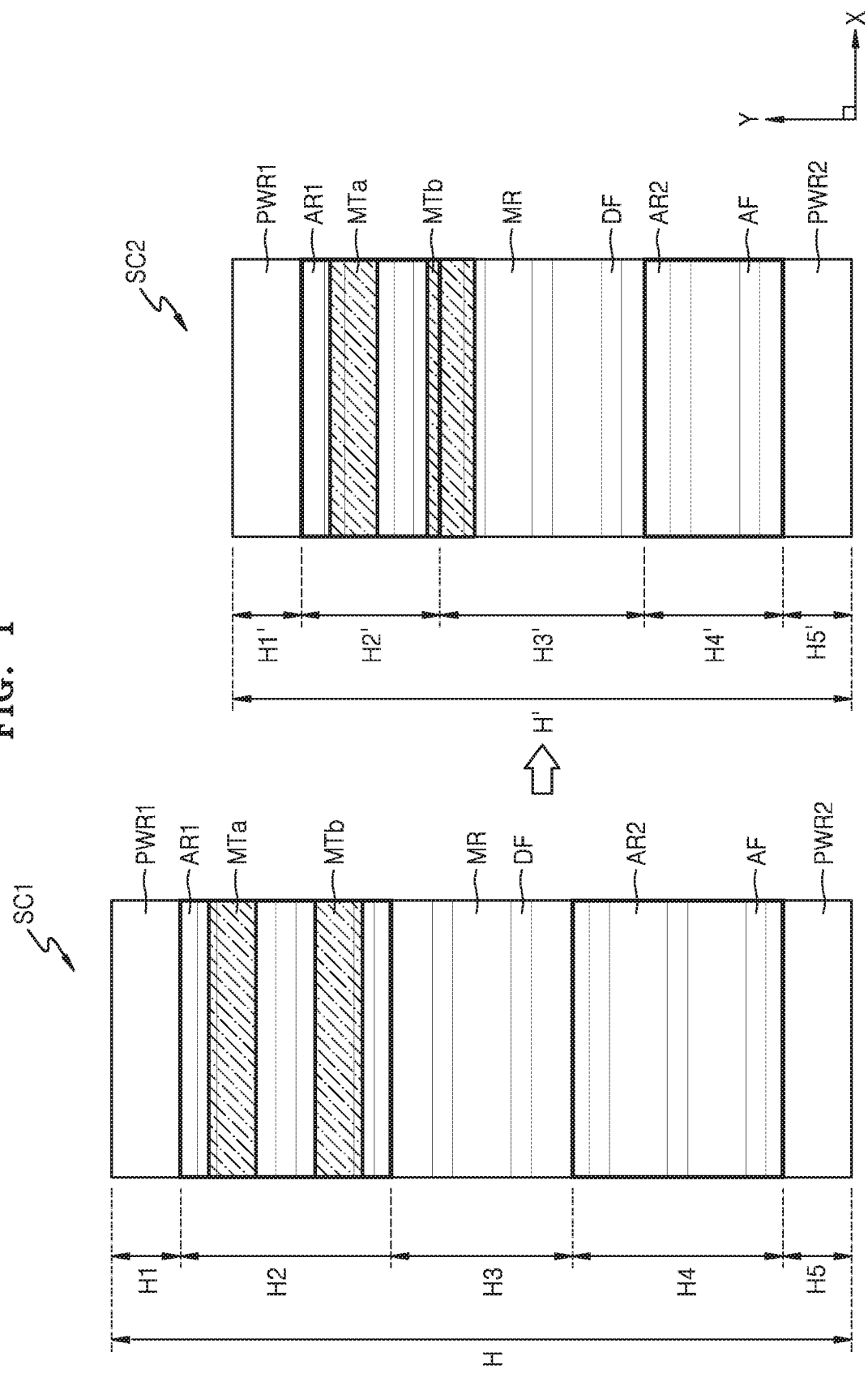
FIG. 1 illustrates first and second standard cells having different heights.

FIG. 1 illustrates first and second standard cells SC1 and SC2 having different heights.

Referring to FIG. 1, the first standard cell SC1 has a first height H and the second standard cell SC2 has a second height H', the second height H' being less than the first height H. And so, the term "height" refers to a dimension of the standard cell as laid out, i.e., a dimension in the layout of the standard cell or a dimension as viewed in a plan view of the cell in an integrated circuit. The first and second heights H and H' may be determined according to the numbers of tracks (hereinafter, referred to as 'track number') above the first and second standard cells SC1 and SC2, respectively. Here, the tracks are conductive lines, extending in a first direction (e.g., the X direction) and arranged parallel to each other, and may correspond to, for example, discrete metal line patterns of a metal layer of a semiconductor device. Metal patterns of a metal layer may constitute what is referred to as a metallization layer.

Each of the first and second standard cells SC1 and SC2 may include first and second power regions PWR1 and PWR2 to which a power supply voltage and a ground voltage are respectively applied, first and second active regions AR1 and AR2, and a middle region MR. The first height H of the first standard cell SC1 may correspond to the sum of respective heights H1 to H5 (i.e., H=H1+H2+H3+H4+H5) of the above-noted regions of the cell SC1 (described in more detail later), and the second height H' of the second standard cell SC2 may correspond to the sum of respective heights H1' to H5' (i.e., H'=H1'+H2'+H3'+H4'+H5') of the above-noted regions of the cell SC2.

Active fins AF extending in the first direction and parallel to each other are arranged in the first and second active regions AR1 and AR2, and dummy fins DF extending in the first direction and parallel to each other are arranged in the middle region MR. Recent developments in semiconductor process technology has allowed for the fin pitch to gradually decrease. Accordingly, as concerns the dimensions of standard cells being placed in a layout of an integrated circuit, the height of the first active region AR1 has gradually decreased from H2 to H2', for example, and the height of the second active region AR2 has gradually decreased from H4 to H4', for example. That is, it is now possible to implement a standard cell having a relatively small height, like the second standard cell SC2, in designing the layout of an integrated circuit.

When scaling down from a standard cell having a relatively great height to a relatively small height, e.g., when implementing the standard cell SC2 in place of the standard cell SC1, the decrease in metal pitch (the pitch of metal tracks) is relatively small as compared with the decrease in the pitch of the fins. For example, two tracks MTa and MTb may be arranged above the first active region AR1 of the first standard cell SC1. On the other hand, if the same two tracks MTa and MTb are arranged above the first active region AR1 of the second standard cell SC2, the lower track MTb of the two tracks MTa and MTb may be outside the first active region AR1. Here, the term "lower" may refer to the track closer to the origin of an X-Y coordinate system in which the origin is located at the "bottom" of the standard cell with the Y axis running in the direction of the height of the cell. As a result, the lower track MTb may affect the position of a contact or via arranged in the middle region MR of the second standard cell SC2, i.e., there is less freedom in design of a metal pattern such as that generated by the routing process.

Figure 2A:
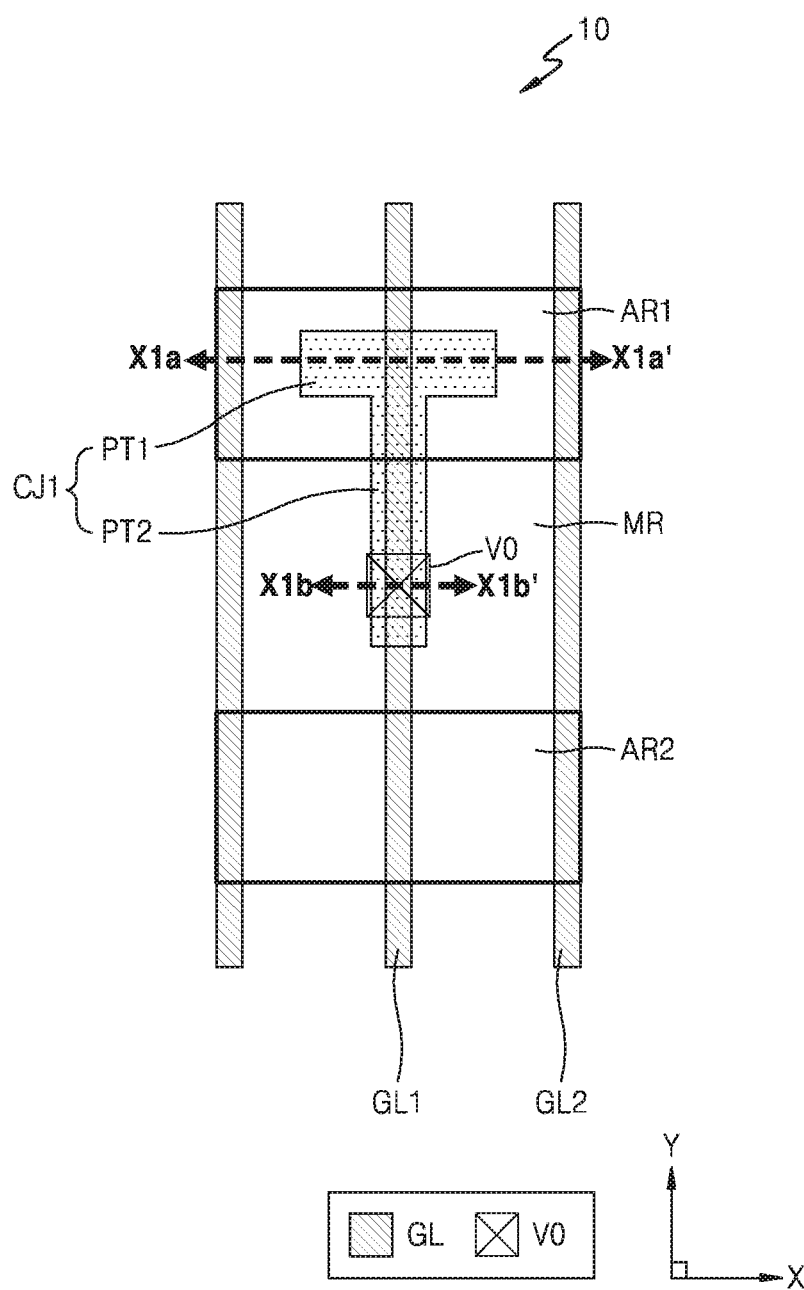
FIG. 2A is a plan view of an example of an integrated circuit according to the inventive concept.

FIG. 2A illustrates a layout of an example of an integrated circuit 10 according to the inventive concept.

Referring to FIG. 2A, the integrated circuit 10 may include first and second active regions AR1 and AR2, a plurality of gate lines GL, a first contact jumper CJ1, and a via V0. Here, the term "contact jumper" refers to a conductor having a relatively short length connecting any two points or two terminals in the integrated circuit 10, and may be referred to simply as "jumper". The integrated circuit 10 may be designed using a standard cell library, and the first and second active regions AR1 and AR2, the plurality of gate lines GL, and the first contact jumper CJ1 may be parts of a standard cell (corresponding to the second standard cell SC2 in FIG. 1, for example).

The first and second active regions AR1 and AR2 may extend in a first direction (e.g., may be elongated in a first direction corresponding to the X direction in the figures) and may be arranged parallel to each other. The first active region AR1 and the second active region AR2 may be spaced apart from each other along a second direction (e.g., the Y direction) substantially perpendicular to the first direction, and may be of different conductivity types. The first and second active regions AR1 and AR2 may be referred to as diffusion regions. A region interposed between the first active region AR1 and the second active region AR2 in the second direction may be defined as a middle region MR. The middle region MR may be referred to as a dummy region or a middle of line (MOL) region. Active fins (e.g., the active fins AF of the standard cell SC2 in FIG. 1) extending in the first direction may be arranged in the first and second active regions AR1 and AR2, and dummy fins (e.g., the dummy fins DF in FIG. 1 of the standard cell SC2) extending in the first direction may be arranged in the middle region MR.

The plurality of gate lines GL may include first and second gate lines GL1 and GL2. Each of the gate lines GL may extend in the second direction and may cross the first and second active regions AR1 and AR2. In addition, the gate lines GL may be spaced apart from each other at regular intervals in the first direction. In this case, the plurality of gate lines GL may correspond to gate electrodes of a semiconductor device. Hereinafter, the first contact jumper CJ1 above the first gate line GL1 will be described in detail. However, the inventive concept is not limited thereto, and the first contact jumper CJ1 may be arranged above any conductive trace to thereby implement a skip device. Also, the term "above" refers to the vertical in the integrated circuit 10 when realized, i.e., in the direction corresponding to that of a Z direction perpendicular to the X and Y directions in the figure. And thus, when one element is "above" the other the layout diagrams show the elements as superimposed.

The first contact jumper CJ1 may include first and second conductive patterns PT1 and PT2 connected to each other. The first conductive pattern PT1 may extend in the first direction and the second conductive pattern PT2 may extend in the second direction. Specifically, the first conductive pattern PT1 may cross the first gate line GL1 above the first active region AR1 and the second conductive pattern PT2 may extend in the second direction above the first gate line GL1 and be connected to the first conductive pattern PT1. In this manner, the first contact jumper CJ1 may have a T-shape, and accordingly, the first contact jumper CJ1 may be referred to as a T-shaped jumper. Note, in the foregoing and in the description that follows and as the context will make clear, the term "extend" will generally refer to a longitudinal or lengthwise direction of an element or feature, especially when the element or feature is a line element or feature.

If the second conductive pattern PT2 is arranged between the first gate line GL1 and the second gate line GL2 so that the first contact jumper CJ1 has an L-shape, a gate contact to be arranged on the second gate line GL2 may interfere with the first contact jumper CJ1. As a result, this may complicate the shapes and positions of gate contacts, vias, and metal patterns to be arranged in the middle region MR, and accordingly the height of the middle region MR in the second direction may need to be increased. Thus, it may be difficult to keep the height of the standard cell to a minimum despite the reduction of the fin pitch.

However, according to the present example, because the second conductive pattern PT2 is arranged above the first gate line GL1 and the first contact jumper CJ1 has a T-shape, interference between the first contact jumper CJ1 and a gate contact to be arranged on the second gate line GL2 may be reduced. Thus, it is possible to form simply the shapes of, i.e., to readily lay out, gate contacts, vias, and metal patterns in the middle region MR, and to align the gate contacts, the vias, and the metal patterns with each other. As a result, an increase in the height of the middle region MR in the second direction may be prevented. Thus, as the fin pitch decreases, the height of the standard cell may be reduced and the total size of the integrated circuit 10 including the standard cell may be reduced.

The first conductive pattern PT1 may electrically connect regions on both sides of the first gate line GL1 in the first active region AR1. Accordingly, the first gate line GL1 may be a dummy gate line, that is, a skipped gate line, which is not a real gate line. However, the position of the first contact jumper CJ1 according to the present example is not limited to a region above the first active region AR1 and the middle region MR. Hereinafter, a modified example of the first contact jumper CJ1 will be described with reference to FIG. 2B.

Figure 2B:
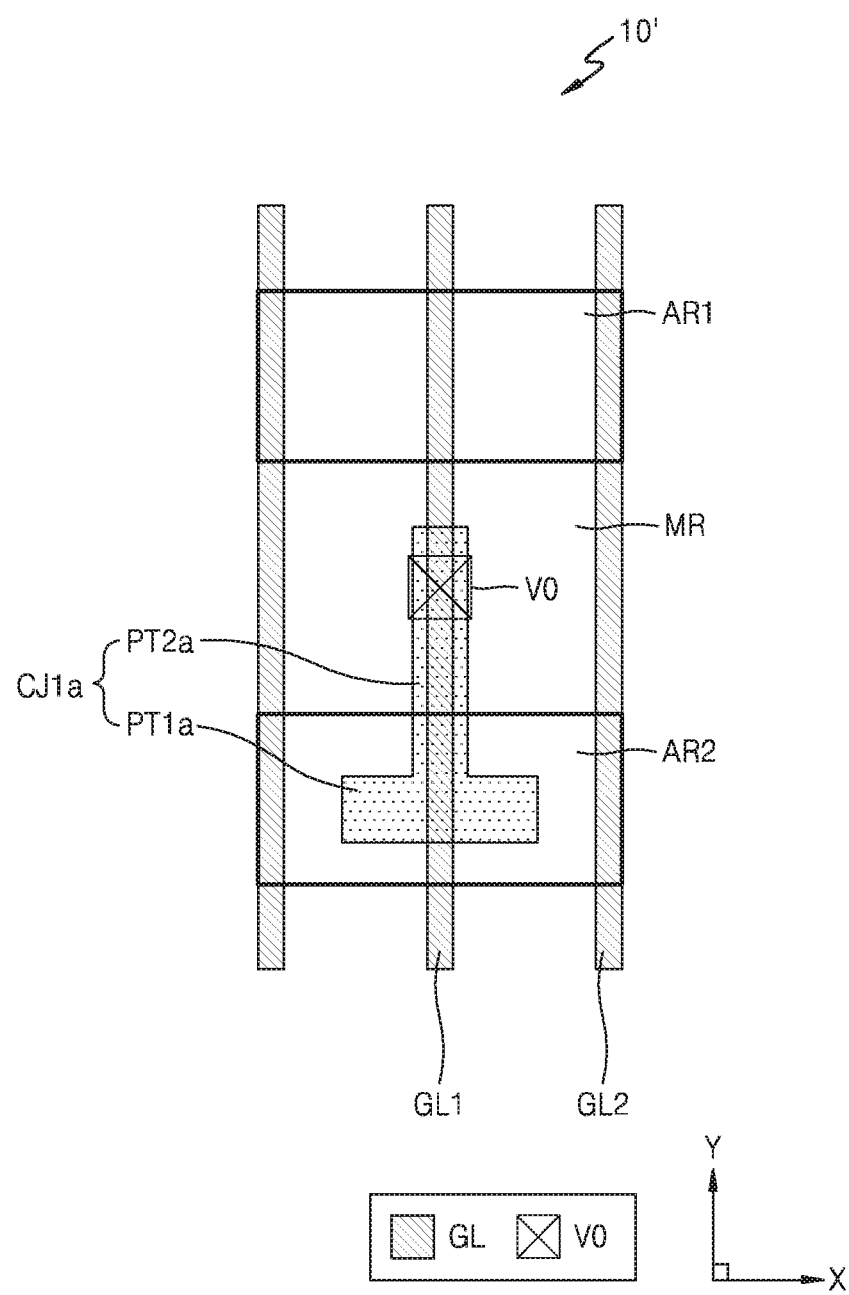
FIG. 2B is a plan view of another example of an integrated circuit according to the inventive concept.

FIG. 2B illustrates a layout of an integrated circuit 10' according to another example.

Referring to FIG. 2B, the integrated circuit 10' may include first and second active regions AR1 and AR2, a plurality of gate lines GL, and a first contact jumper CJ1a. The first contact jumper CJ1a may include first and second conductive patterns PT1a and PT2a connected to each other. The first conductive pattern PT1a may extend in a first direction (e.g., the X direction), and the second conductive pattern PT2a may extend in a second direction (e.g., the Y direction). Specifically, the first conductive pattern PT1a may cross a first gate line GL1 above the second active region AR2 and the second conductive pattern PT2a may extend in the second direction above the first gate line GL1 and be connected to the first conductive pattern PT1a. In this manner, the first contact jumper CJ1a may have an inverted T-shape. The first conductive pattern PT1a of the first contact jumper CJ1a may electrically connect regions on both sides of the first gate line GL1 in the second active region AR2. Accordingly, the first gate line GL1 may be a dummy gate line.

Referring back to FIG. 2A, the via V0 may be arranged on the second conductive pattern PT2 of the first contact jumper CJ1. In an example, the via V0 may be arranged on the second conductive pattern PT2 in a middle region MR. Accordingly, a routing interconnection line, for example, a first metal layer (e.g., a metal layer M1 in FIG. 21B), to be arranged on the via V0 may be arranged above the middle region MR rather than the first active region AR1. However, the position of the via V0 is not limited to the middle region MR and in some examples the via V0 may be arranged on the second conductive pattern PT2 in the first active region AR1 or the second active region AR2 depending on the length of the second conductive pattern PT2.

In an example, the first contact jumper CJ1 may be formed using a single mask. For example, the first contact jumper CJ1 may be formed using a mask for forming an active contact, such as a source/drain contact. As another example, the first contact jumper CJ1 may be formed using a mask for forming a gate contact. Hereinafter, an example in which the first contact jumper CJ1 is formed using a single mask will be described with reference to FIG. 3.

Figure 3:
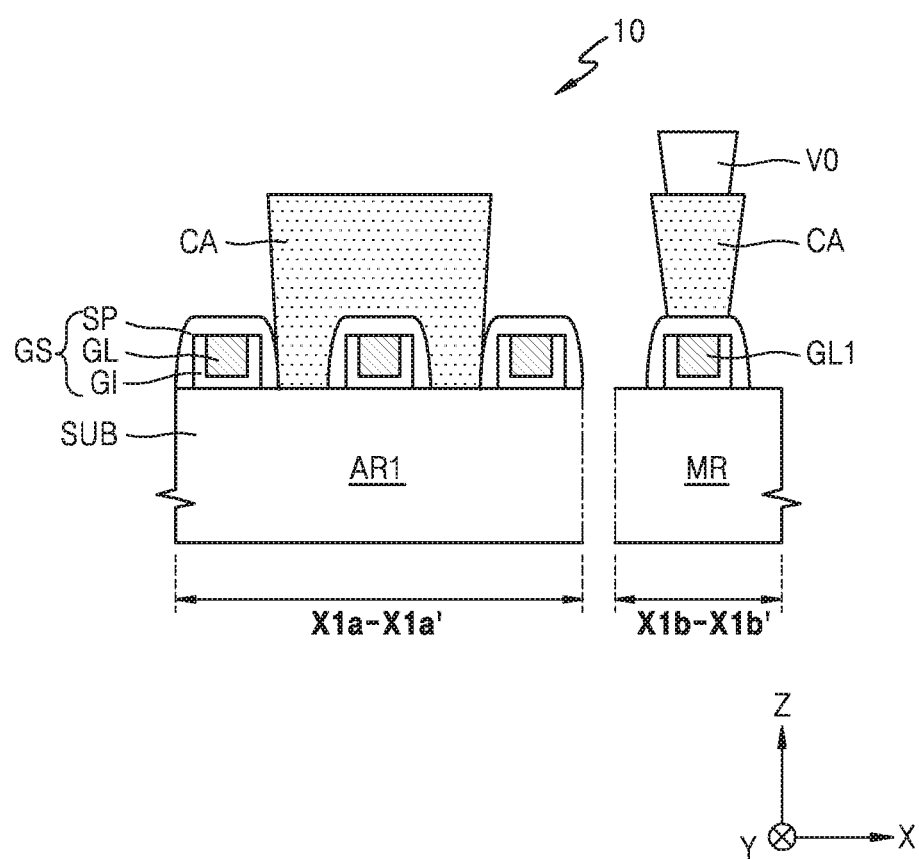
FIG. 3 is a cross-sectional view of respective parts of the integrated circuit of FIG. 2A taken along lines X1a-X1a' and X1b-X1b' in FIG. 2A.

FIG. 3 is a cross-sectional view taken along lines X1a-X1a' and X1b-X1b' in FIG. 2A.

Referring to FIG. 3, the integrated circuit 10 may be an example of an integrated circuit device, i.e., a semiconductor device, manufactured in accordance with the layout of FIG. 2A. In the present example, the first and second conductive patterns PT1 and PT2 of the first contact jumper CJ1 may be embodied as a first contact CA. The first contact CA may also be referred to as an active contact.

A substrate SUB may be a semiconductor substrate, and for example, the semiconductor substrate may include silicon, silicon-on-insulator (SOI), silicon-on-sapphire, germanium, silicon-germanium, or gallium-arsenide. The substrate SUB may include first and second active regions AR1 and AR2 and a middle region MR. For example, a shallow trench isolation (STI) may be arranged in the substrate SUB to separate the middle region MR from the first and second active regions AR1 and AR2.

A plurality of gate insulating films GI and a plurality of gate lines GL may extend in the second direction (e.g., the Y direction) on the substrate SUB. The plurality of gate insulating films GI may include a silicon oxide film, a high-k film, or a combination thereof. The plurality of gate lines GL may include a metal material, such as tungsten (W), tantalum (Ta), cobalt (Co), or copper (Cu), a nitride thereof, a silicide thereof, and a doped polysilicon, and may be formed using, for example, a deposition process. An upper surface and both side wall surfaces of each of the gate lines GL are covered with an insulating spacer SP. The insulating spacer SP may extend parallel to the gate line GL in the second direction. The insulating spacer SP may include a silicon nitride film, a SiOCN film, a SiCN film, or a combination thereof. The gate insulating film GI, the gate line GL, and the insulating spacer SP may constitute a gate structure GS.

The first contact CA may be formed on the substrate SUB on which the gate structure GS is formed. The first contact CA may cross the first gate line GL1 in the first active region AR1, and may be arranged above the first gate line GL1 in the middle region MR. The first contact CA may include any material having electrical conductivity, for example, tungsten. The via V0 may be arranged on the first contact CA arranged above the first gate line GL1 in the middle region MR.

Figure 4:
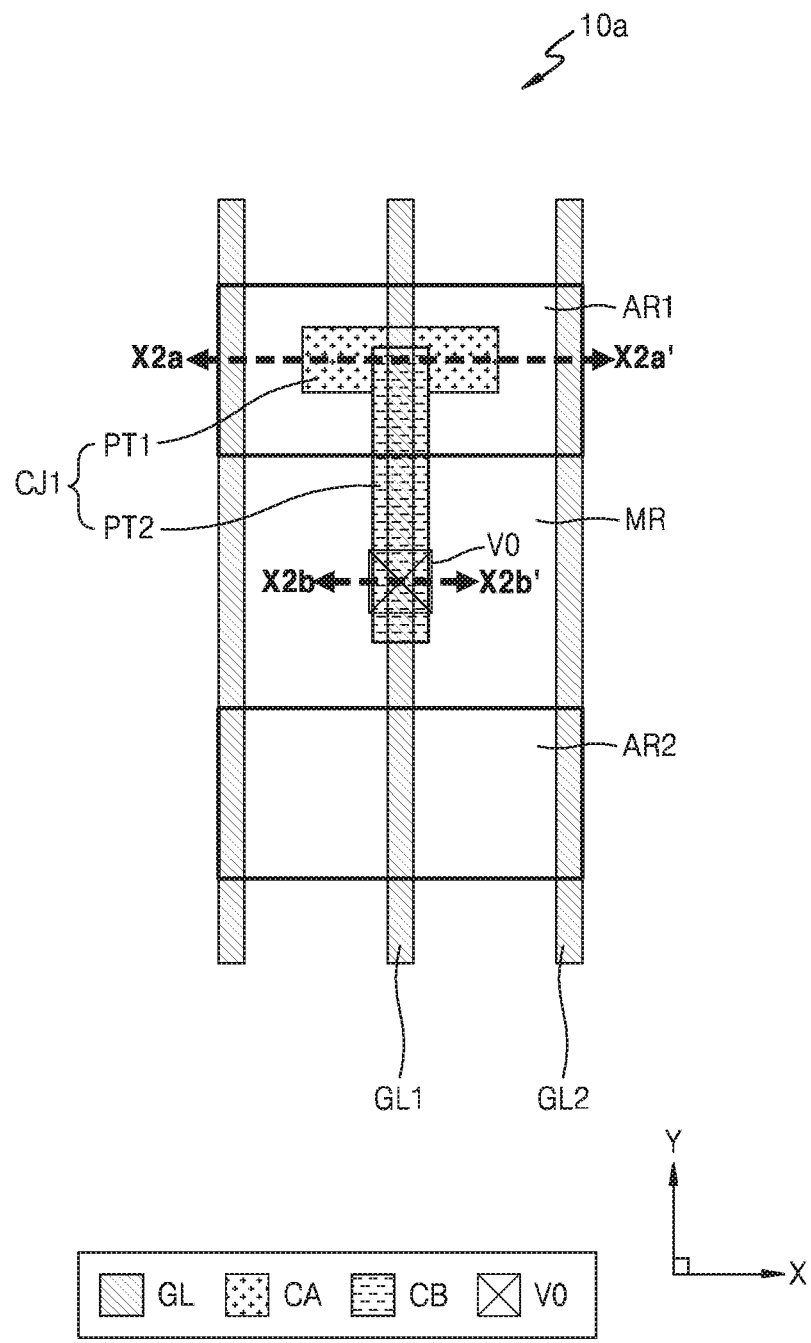
FIG. 4 is a plan view of an example of an integrated circuit according to the inventive concept.
Figure 5:
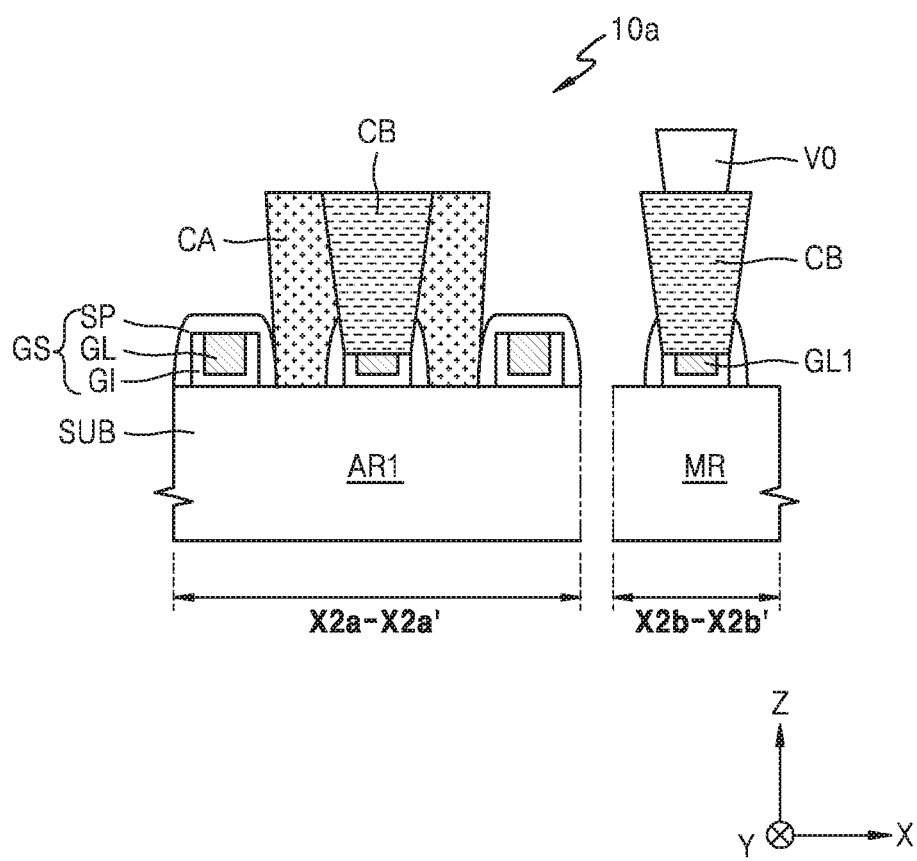
FIG. 5 is a cross-sectional view taken along lines X2a-X2a' and X2b-X2b' in FIG. 4.

FIG. 4 illustrates a layout of an integrated circuit 10a according to an example, and FIG. 5 is a cross-sectional view taken along lines X2a-X2a' and X2b-X2b' in FIG. 4.

Referring to FIGS. 4 and 5, a first conductive pattern PT1 of a first contact jumper CJ1 may be embodied as a first contact CA, and a second conductive pattern PT2 of the first contact jumper CJ1 may be embodied as a second contact CB. Accordingly, the first contact jumper CJ1 may be formed using a first mask for the first contact CA and a second mask for the second contact CB.

In an example, the first contact CA may correspond to an active contact, such as a source/drain contact, and the second contact CB may correspond to a gate contact. In this case, the first and second contacts CA and CB may overlap each other in some areas. Upper surface levels of the first and second contacts CA and CB may be substantially equal to each other. A lower surface level of the first contact CA may be equal to an upper surface level of the substrate SUB, and a lower surface level of the second contact CB may be lower than an upper surface level of a gate structure GS, and accordingly, the second contact CB may be connected to the first gate line GL1.

Figure 6:
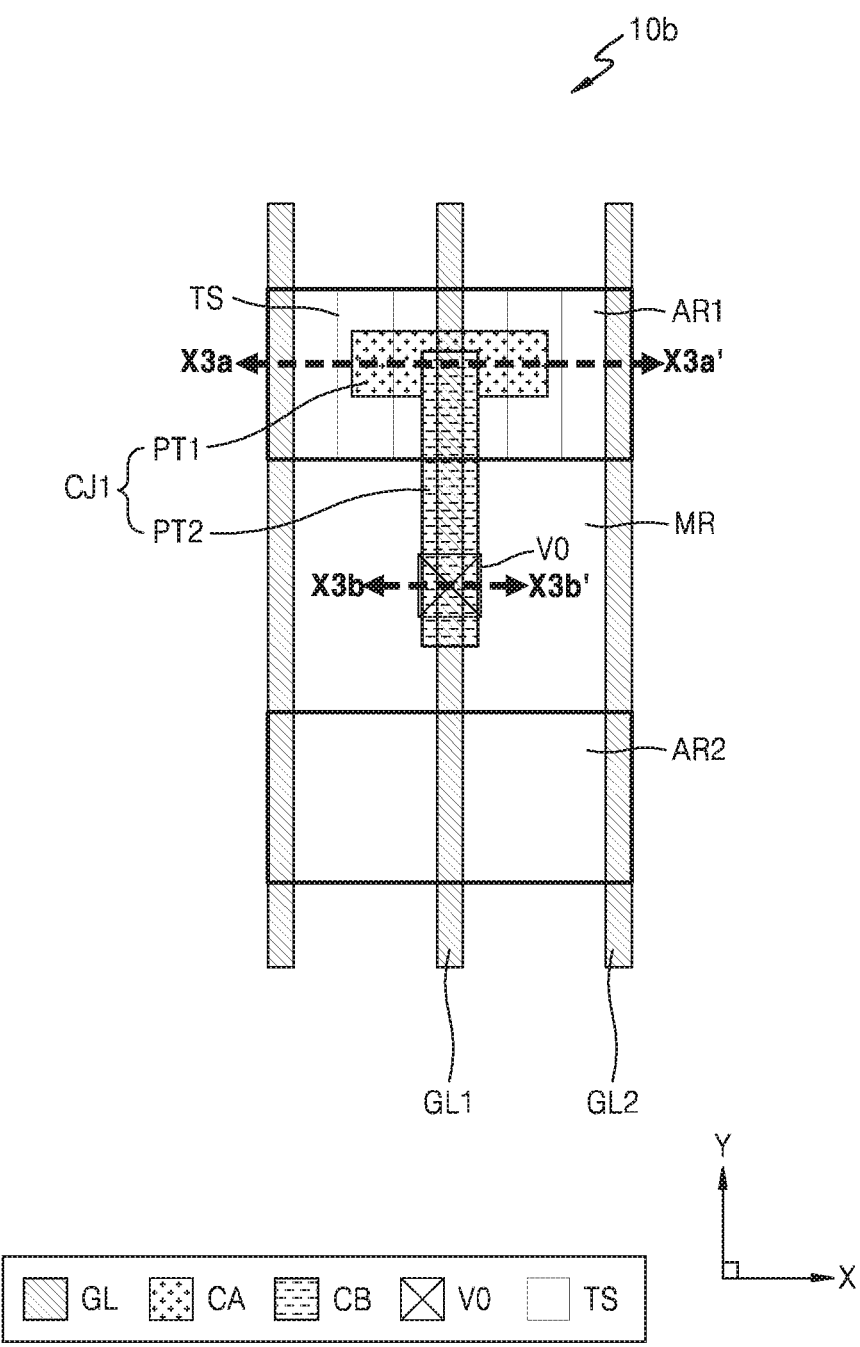
FIG. 6 is a plan view of an example of an integrated circuit according to the inventive concept.
Figure 7:
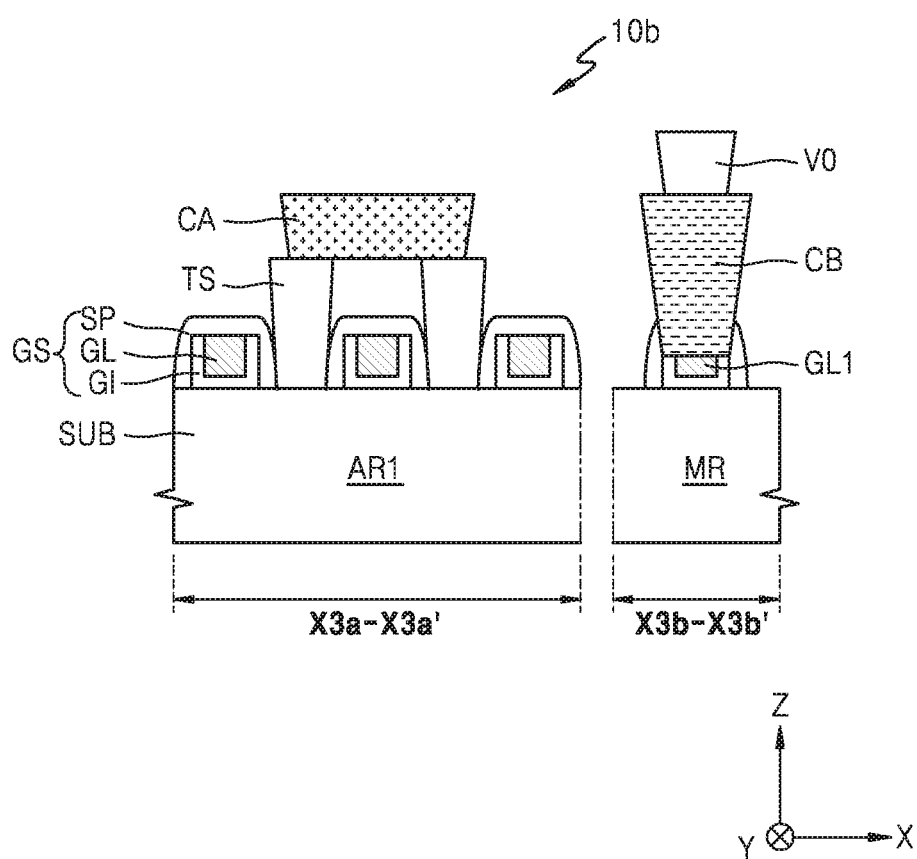
FIG. 7 is a cross-sectional view taken along lines X3a-X3a' and X3b-X3b' in FIG. 6.

FIG. 6 illustrates a layout of an integrated circuit 10b according to an example, and FIG. 7 is a cross-sectional view taken along lines X3a-X3a' and X3b-X3b' in FIG. 6.

Referring to FIGS. 6 and 7, the integrated circuit 10b is similar to the integrated circuit 10a illustrated in FIG. 4 but further include trench silicides TS. The trench silicides TS may be respectively arranged between two adjacent gate lines GL in a first active region AR1. The trench silicides TS may extend in a second direction (e.g., the Y direction), and the lengths of the trench silicides TS in the second direction may be substantially equal to the length of the first active region AR1 in the second direction. Each of the trench silicides TS may include a conductive material such as tungsten (W), cobalt (Co), or copper (Cu).

In an example, the heights of the trench silicides TS in a third direction (e.g., the Z direction) may be greater than the height of a gate structure GS in the third direction. A first contact CA may be arranged on the trench silicides TS. Accordingly, the first contact CA may not be connected to the gate structure GS.

Figure 8:
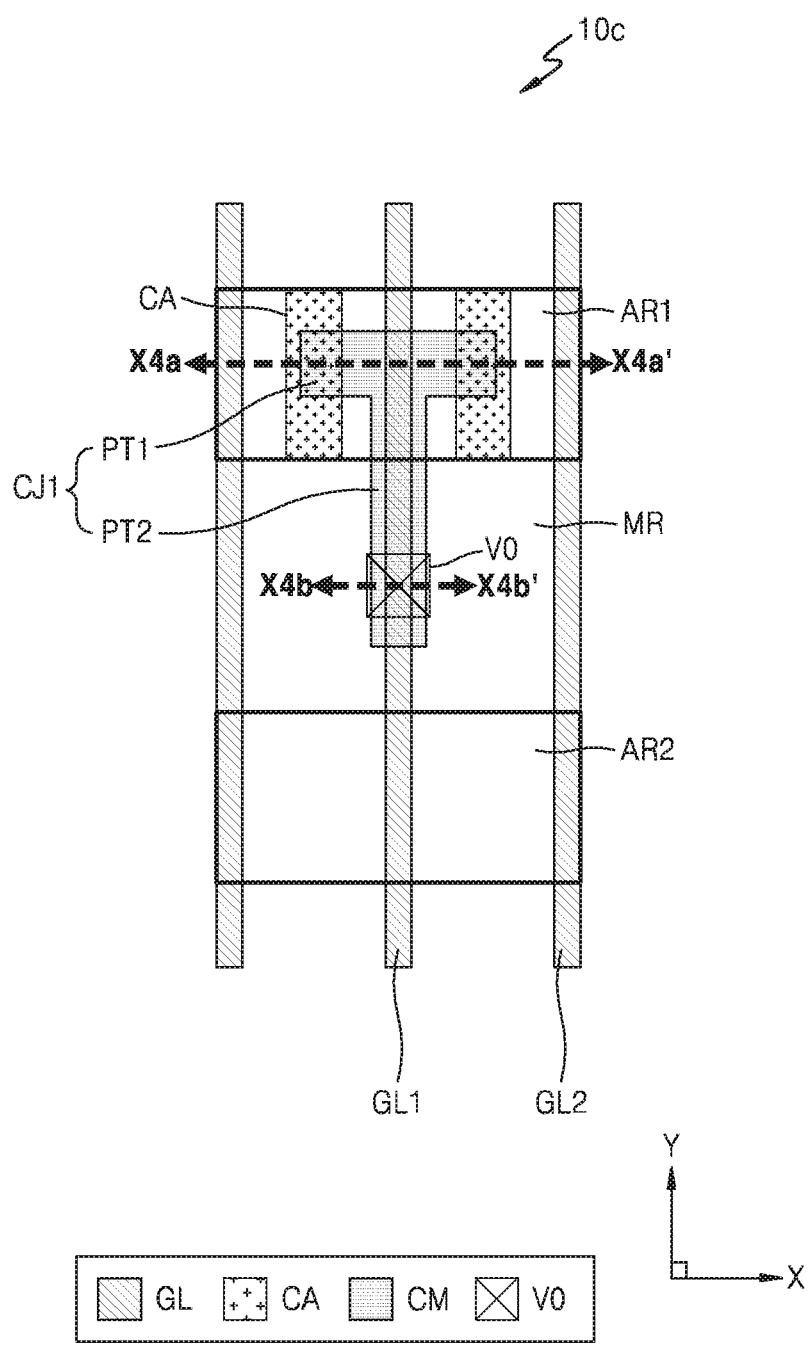
FIG. 8 is a plan view of an example of an integrated circuit according to the inventive concept.
Figure 9:
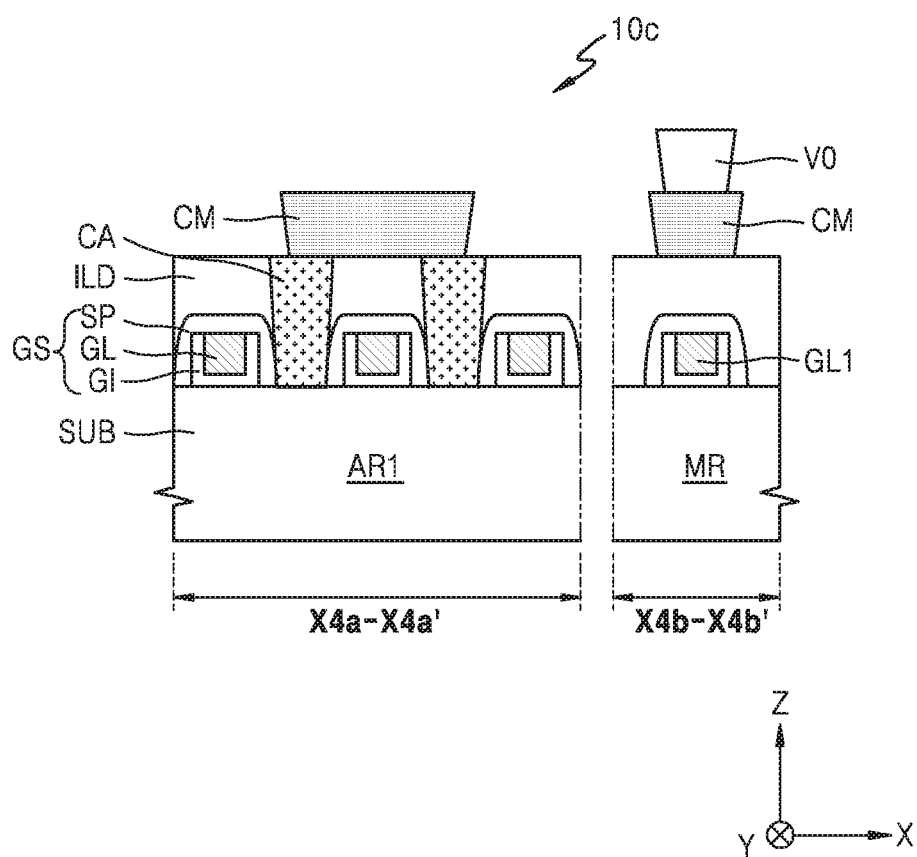
FIG. 9 is a cross-sectional view taken along lines X4a-X4a' and X4b-X4b' in FIG. 8.
Figure 10:
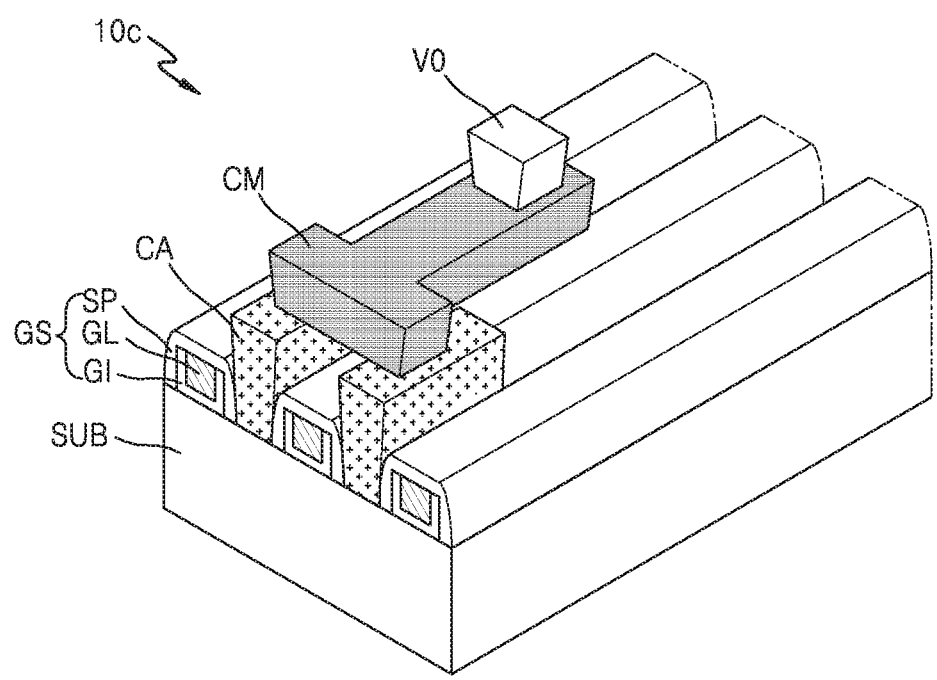
FIG. 10 is a perspective view of the integrated circuit of FIG. 8.

FIG. 8 illustrates a layout of an integrated circuit 10c according to an example, FIG. 9 is a cross-sectional view taken along lines X4a-X4a' and X4b-X4b' in FIG. 8, and FIG. 10 is a perspective view of the integrated circuit 10c of FIG. 8.

Referring to FIGS. 8 to 10, the integrated circuit 10c is similar to the integrated circuit 10 illustrated in FIG. 2A but include first contacts CA as compared to the integrated circuit 10 of FIG. 2A. The first contacts CA may be respectively arranged between two adjacent gate lines GL in a first active region AR1. The first contacts CA may extend in a second direction (e.g., the Y direction), and the lengths of the first contacts CA in the second direction may be substantially equal to the length of the first active region AR1 in the second direction. The heights of the first contacts CA in a third direction (e.g., the Z direction) may be greater than the height of a gate structure GS in the third direction. An interlayer dielectric layer ILD may be arranged above the gate structure GS. The interlayer dielectric layer ILD may include an insulating material, e.g., an oxide, nitride, or oxynitride.

In addition, first and second conductive patterns PT1 and PT2 of a first contact jumper CJ1 may be embodied as a third contact CM. For example, the third contact CM may correspond to a merge contact and may merge the first contacts CA spaced apart from each other. The third contact CM may be arranged above the first contacts CA and the interlayer dielectric layer ILD. Accordingly, the distance from a substrate SUB to a lower surface of the third contact CM may be greater than the height of the gate structure GS in the third direction, thereby securing room for insulation between the third contact CM and the gate structure GS, specifically, gate lines GL. A via V0 may be arranged on the third contact CM in a middle region MR.

Figure 11:
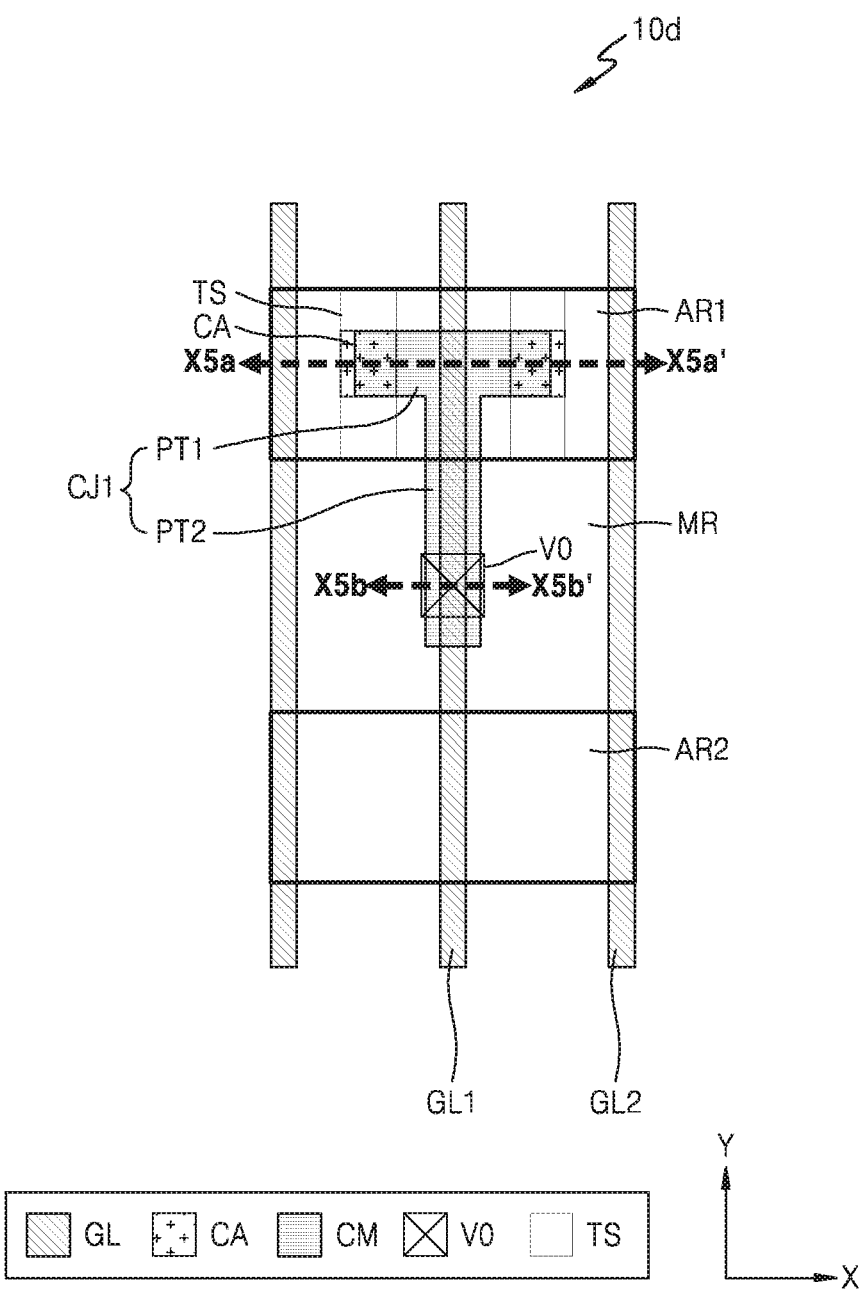
FIG. 11 is a plan view of an example of an integrated circuit according to the inventive concept.
Figure 12:
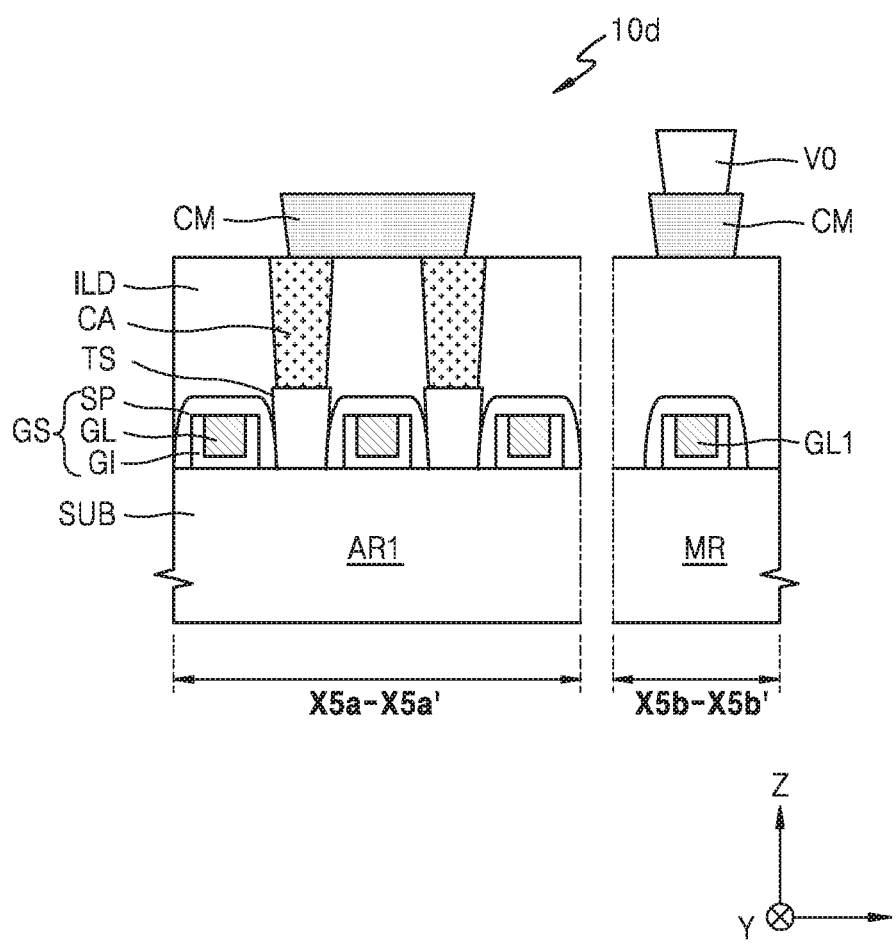
FIG. 12 is a cross-sectional view taken along lines X5a-X5a' and X5b-X5b' in FIG. 11.

FIG. 11 illustrates a layout of an integrated circuit 10d according to an example, and FIG. 12 is a cross-sectional view taken along lines X5a-X5a' and X5b-X5b' in FIG. 11.

Referring to FIGS. 11 and 12, the integrated circuit 10d is similar to the example of the integrated circuit 10c illustrated in FIG. 8 but further include trench silicides TS. The trench silicides TS may be respectively arranged between two adjacent gate lines GL in a first active region AR1. The trench silicides TS may extend in a second direction (e.g., the Y direction), and the lengths of the trench silicides TS in the second direction may be substantially equal to the length of the first active region AR1 in the second direction. In addition, the first contacts CA may be shorter in the second direction than the trench silicides TS in the second direction.

Figure 13:
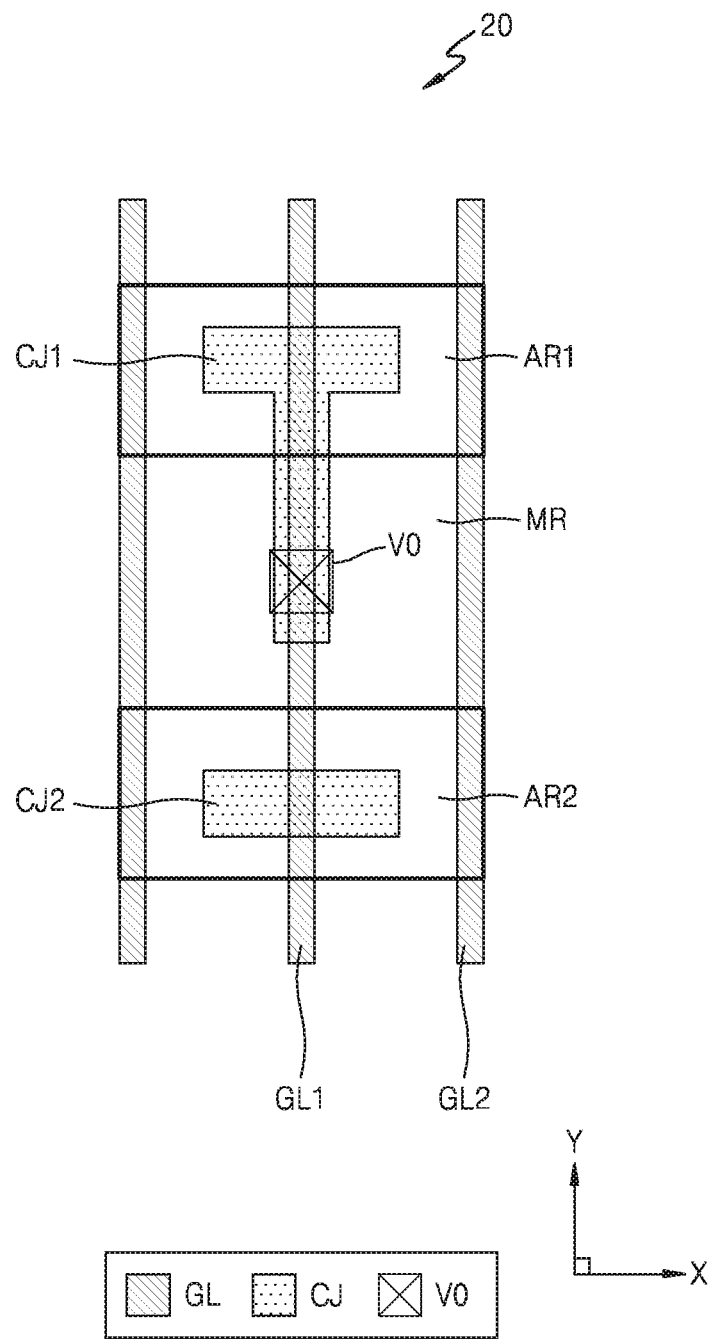
FIGS. 13, 14, 15, 16, 17, 18 and 19 are plan views of examples of integrated circuits according to the inventive concept.

FIG. 13 illustrates a layout of an integrated circuit 20 according to an example.

Referring to FIG. 13, the integrated circuit 20 is similar to the example of the integrated circuit 10 of FIG. 2A but includes a second contact jumper CJ2. The second contact jumper CJ2 may extend in a first direction (e.g., the X direction) and cross a first gate line GL1 above a second active region AR2. In this case, the second contact jumper CJ2 is spaced apart from a first contact jumper CJ1. The first and second contact jumpers CJ1 and CJ2 may be realized in any of the forms and using any of the corresponding techniques described above with reference to FIGS. 2A to 12.

In an example, the first and second contact jumpers CJ1 and CJ2 may be implemented using three masks. For example, the first contact jumper CJ1 may be formed of a first contact CA and a third contact CM, and the second contact jumper CJ2 may be formed of a second contact CB. In an example, the first and second contact jumpers CJ1 and CJ2 may be implemented using two masks. For example, the first contact jumper CJ1 may be formed of the first contact CA, and the second contact jumper CJ2 may be formed of the second contact CB. In an example, the first and second contact jumpers CJ1 and CJ2 may be implemented using a single mask. For example, the first and second contact jumpers CJ1 and CJ2 may be formed of the first contact CA.

Figure 14:
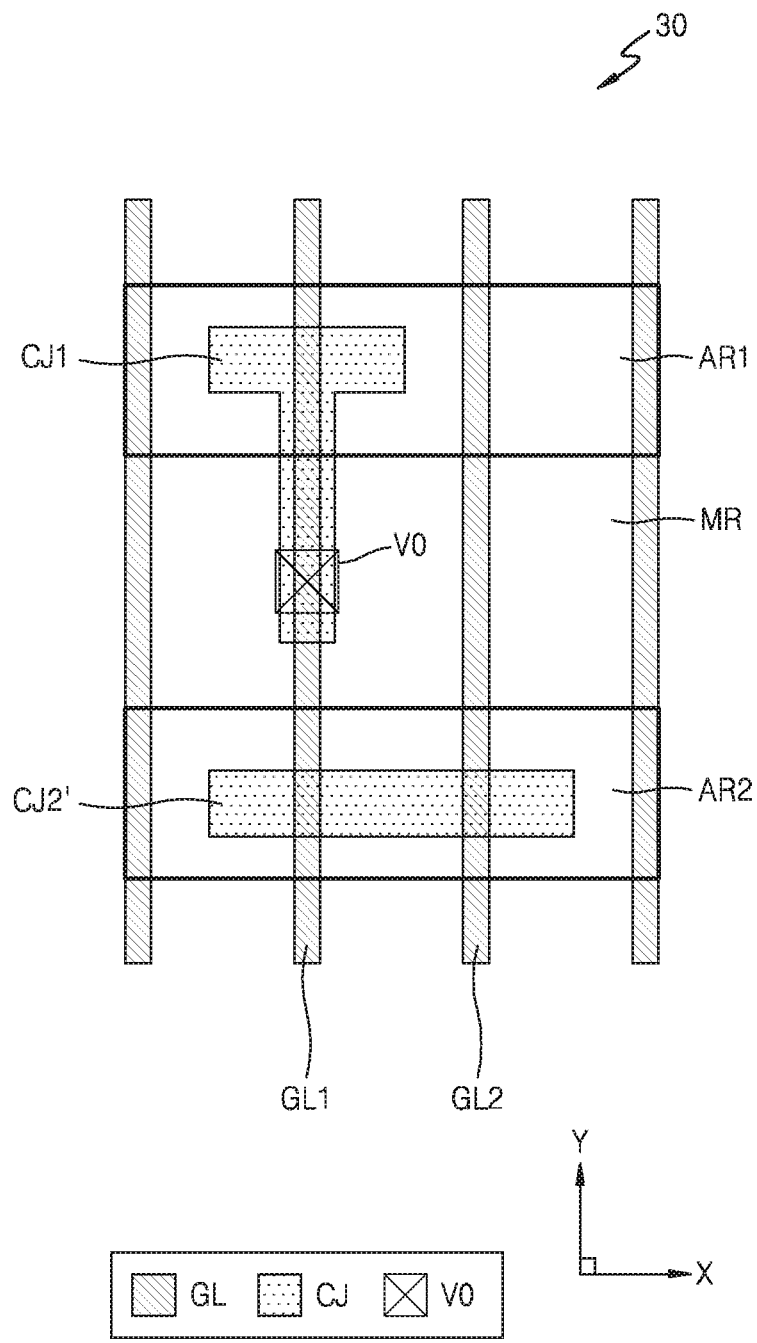

FIG. 14 illustrates a layout of an integrated circuit 30 according to an example.

Referring to FIG. 14, the integrated circuit 30 is similar to the example of the integrated circuit 20 of FIG. 13, but in this example the length of a first contact jumper CJ1 in a first direction (e.g., the X direction) and the length of a second contact jumper CJ2' in the first direction (e.g., the X direction) are different from each other. The second contact jumper CJ2' may extend in the first direction and cross first and second gate lines GL1 and GL2 above a second active region AR2. In this manner, the length of the second contact jumper CJ2' in the first direction is greater than the length of the second contact jumper CJ2 of FIG. 13 in the first direction. The inventive concept is not limited thereto, and in some examples, the length of the second contact jumper CJ2' in the first direction may extend further than in the illustrated example, i.e., the second contact jumper CJ2' may cross three or more gate lines GL.

Figure 15:
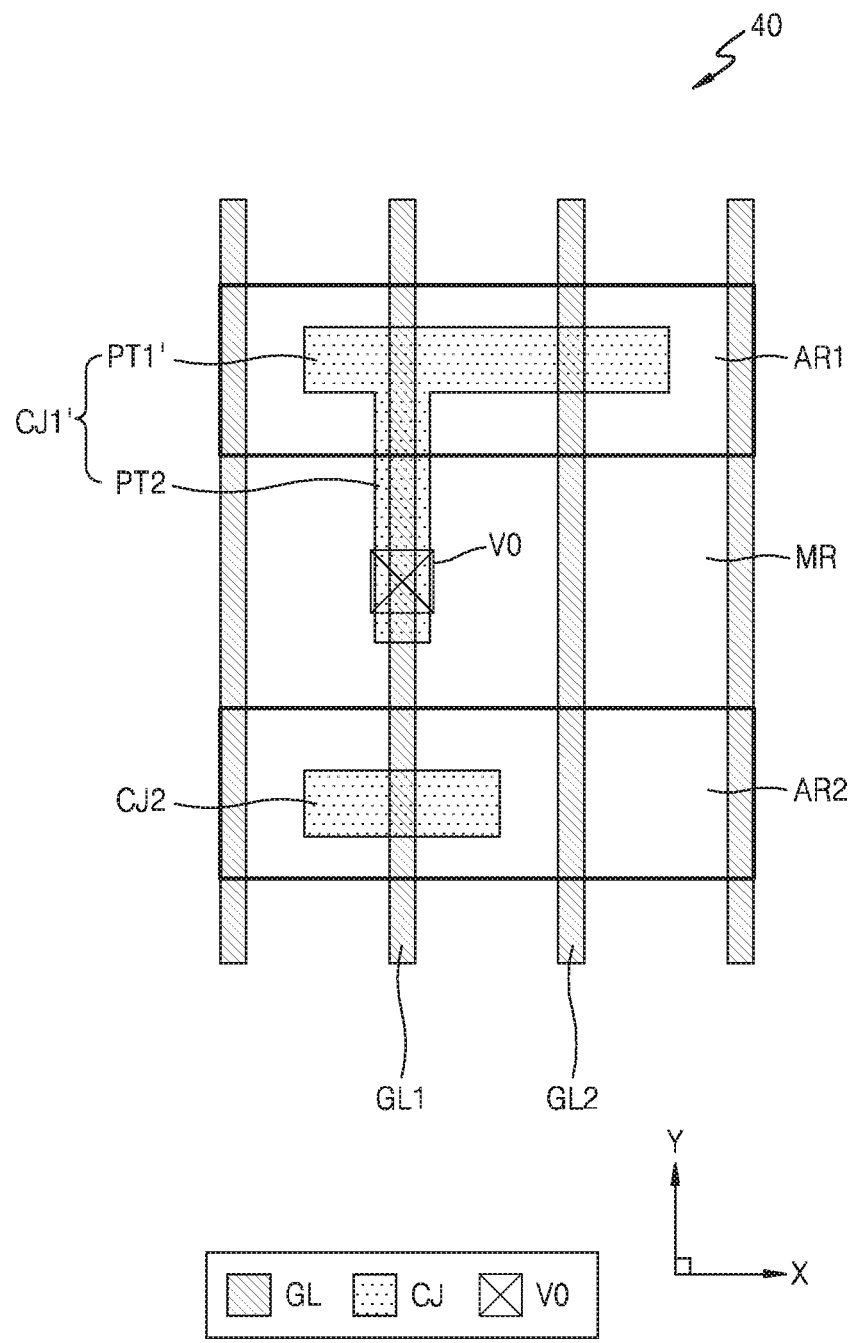

FIG. 15 illustrates a layout of an integrated circuit 40 according to an example.

Referring to FIG. 15, the integrated circuit 40 is similar to the example of the integrated circuit 20 of FIG. 13, but the length of a first contact jumper CJ1' in a first direction (e.g., the X direction) and the length of a second contact jumper CJ2 in the first direction (e.g., the X direction) are different from each other. A first conductive pattern PT1' of the first contact jumper CJ1' may extend in the first direction and cross first and second gate lines GL1 and GL2 above a first active region AR1. In this manner, the length of the first conductive pattern PT1' of the first contact jumper CJ1' in the first direction is greater than the length of the first conductive pattern PT1 of the first contact jumper CJ1 of FIG. 13 in the first direction. However, the inventive concept is not limited thereto, and in some examples, the length of the first conductive pattern PT1' of the first contact jumper CJ1' in the first direction may extend further than in the illustrated example, i.e., the first contact jumper CJ1' may cross three or more gate lines GL.

Figure 16:
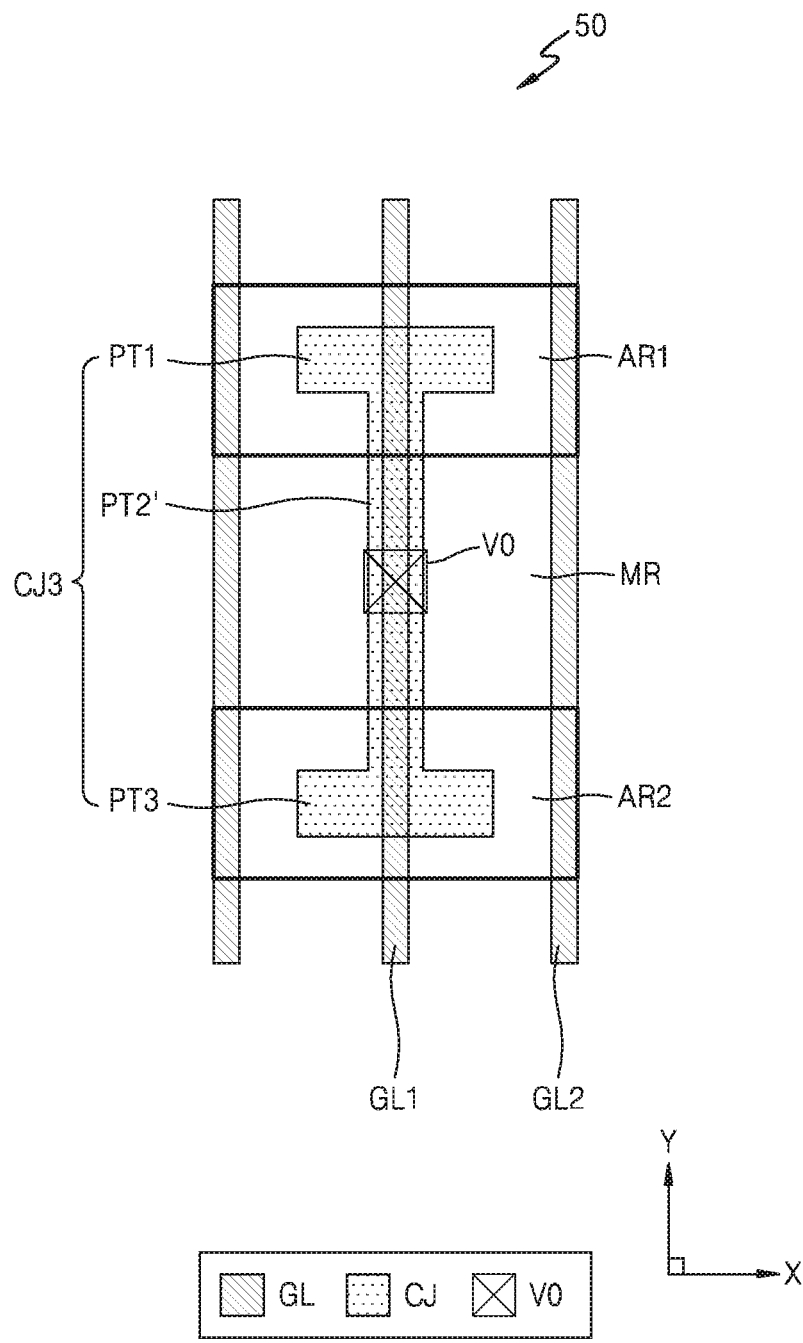

FIG. 16 illustrates a layout of an integrated circuit 50 according to an example.

Referring to FIG. 16, the integrated circuit 50 may include first and second active regions AR1 and AR2, a plurality of gate lines GL, and a third contact jumper CJ3. The third contact jumper CJ3 may include first to third conductive patterns PT1, PT2', and PT3 connected to each other. The first and third conductive patterns PT1 and PT3 may extend in a first direction (e.g., the X direction), and the second conductive pattern PT2' may extend in a second direction (e.g., the Y direction). Specifically, the first conductive pattern PT1 may cross a first gate line GL1 above a first active region AR1, the second conductive pattern PT2' may extend in the second direction above the first gate line GL1 and be connected to the first conductive pattern PT1, and the third conductive pattern PT3 may cross the first gate line GL1 above the second active region AR2. In this manner, the third contact jumper CJ3 may have an I-shape or H-shape.

The first conductive pattern PT1 may electrically connect regions on both sides of the first gate line GL1 in the first active region AR1. The third conductive pattern PT3 may electrically connect regions on both sides of the first gate line GL1 in the second active region AR2. In addition, the second conductive pattern PT2' may connect the first and third conductive patterns PT1 and PT3 to each other. Accordingly, the first gate line GL1 may be a dummy gate line, that is, a skipped gate line, which is not a real gate line (i.e., which is not active in the integrated circuit 50).

In an example, the first to third conductive patterns PT1, PT2', and PT3 may be implemented using three masks. For example, the first to third conductive patterns PT1, PT2', and PT3 may be realized as a first contact CA, a second contact CB, and a third contact CM, respectively. In an example, the first to third conductive patterns PT1, PT2', and PT3 may be implemented using two masks. For example, the first to third conductive patterns PT1, PT2', and PT3 may be realized as the first contact CA and the third contact CM. In an example, the first to third conductive patterns PT1, PT2', and PT3 may be implemented using a single mask. For example, the first to third conductive patterns PT1, PT2', and PT3 may be realized as the first contact CA or the second contact CB.

Figure 17:
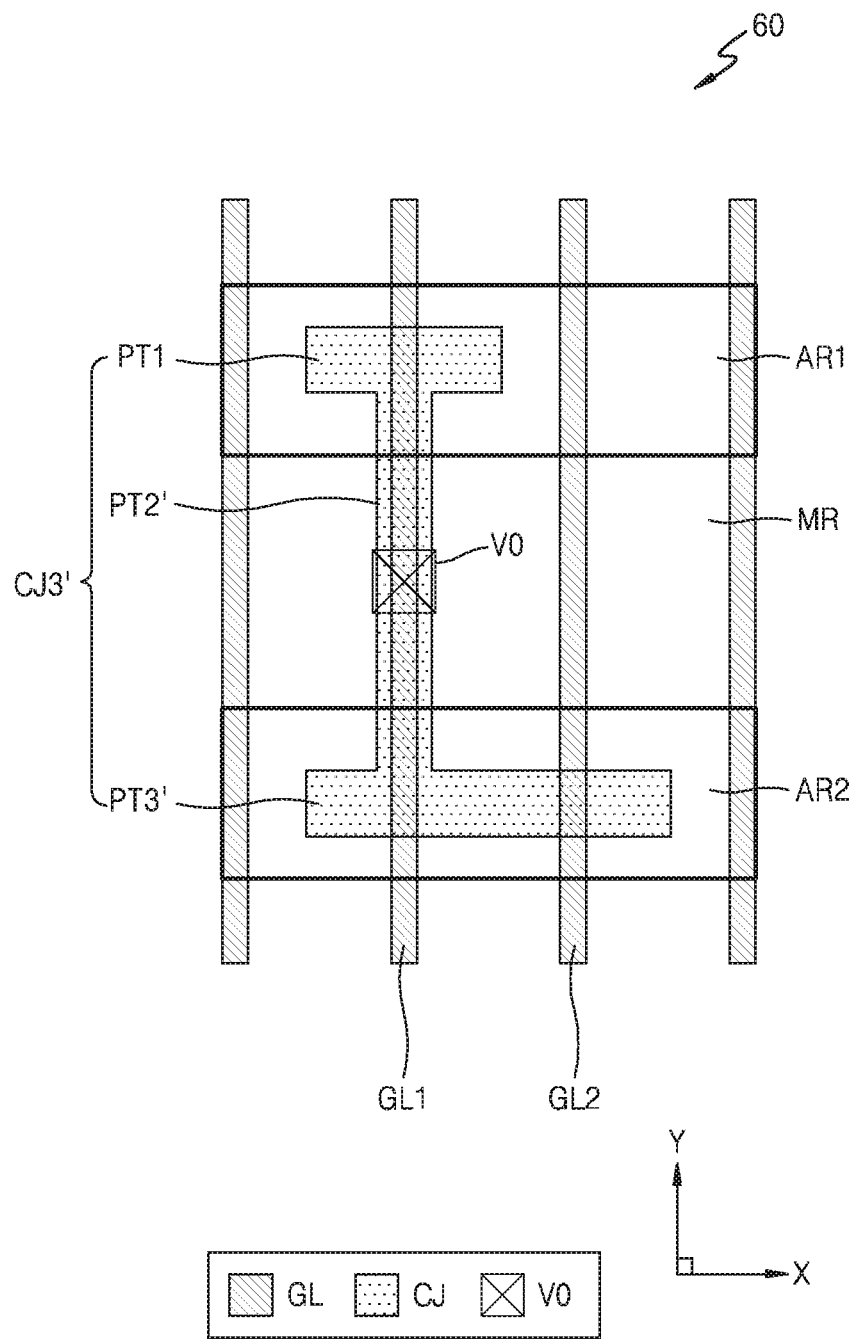

FIG. 17 illustrates a layout of an integrated circuit 60 according to an example.

Referring to FIG. 17, the integrated circuit 60 is similar to the example of the integrated circuit 50 of FIG. 16. In this example, though, third conductive pattern PT3' of a third contact jumper CJ3' may extend in a first direction (e.g., the X direction) and cross first and second gate lines GL1 and GL2 above a second active region AR2. In this manner, the length of the third conductive pattern PT3' of the third contact jumper CJ3' in the first direction is greater than the length of the third conductive pattern PT3 of the third contact jumper CJ3 of FIG. 16 in the first direction. The inventive concept is not limited thereto, and in some examples, the length of the third conductive pattern PT3' of the third contact jumper CJ3' in the first direction may extend further than in the illustrated example, i.e., the third contact jumper CJ3' may cross three or more gate lines GL.

Figure 18:
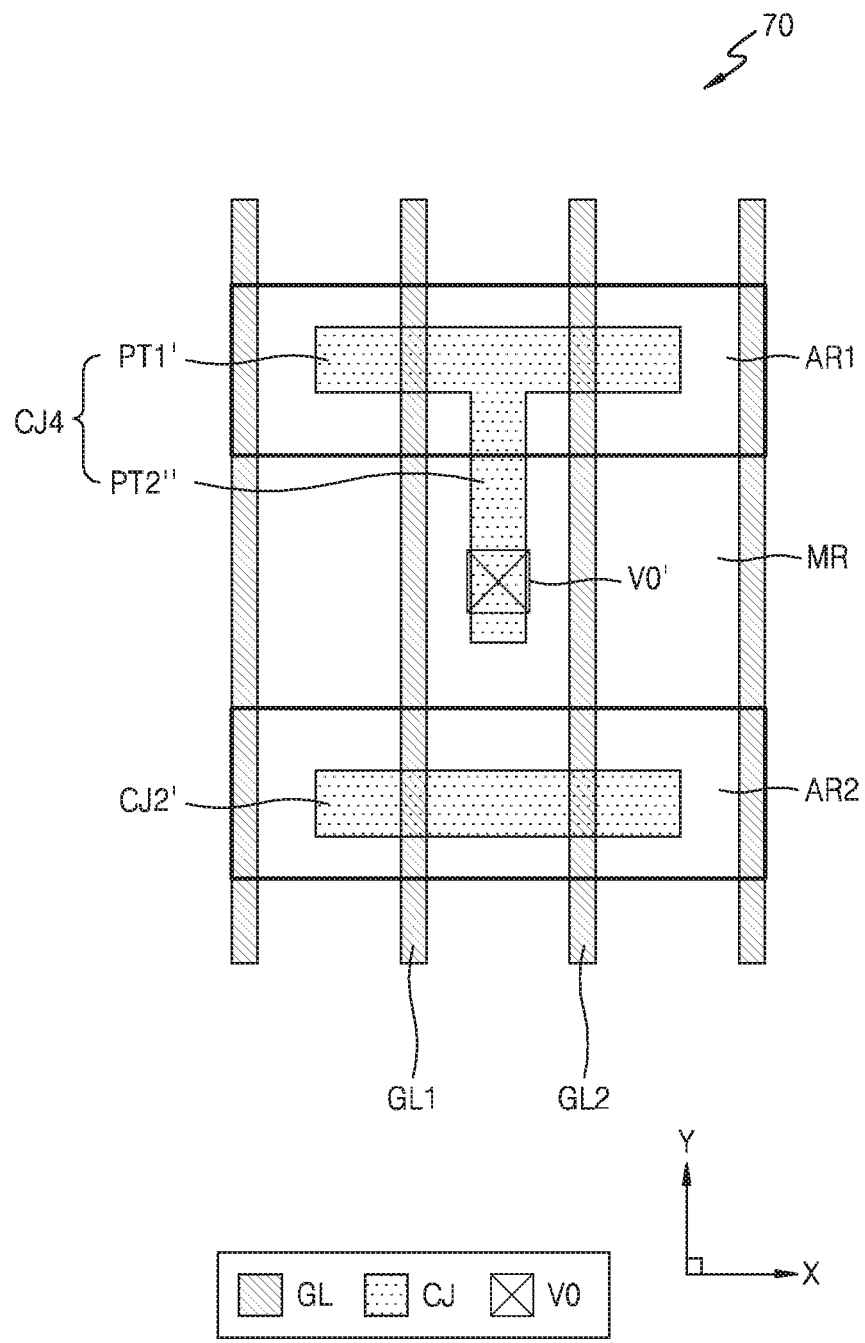

FIG. 18 illustrates a layout of an integrated circuit 70 according to an example.

Referring to FIG. 18, the integrated circuit 70 is similar to the example of the integrated circuit 30 of FIG. 14 but includes first and second active regions AR1 and AR2, a plurality of gate lines GL, a fourth contact jumper CJ4, and a second contact jumper CJ2'. The fourth contact jumper CJ4 may include first and second conductive patterns PT1' and PT2" connected to each other. The first conductive pattern PT1' may extend in a first direction (e.g., the X direction), and the second conductive pattern PT2" may extend in a second direction (e.g., the Y direction).

Specifically, the first conductive pattern PT1' may cross first and second gate lines GL1 and GL2 above the first active region AR1, and the second conductive pattern PT2" may extend in the second direction between the first and second gate lines GL1 and GL2 and may be connected to the first conductive pattern PT1'. In this manner, the fourth contact jumper CJ4 may have a T-shape. In the first active region AR1, the first conductive pattern PT1' of the fourth contact jumper CJ4 may electrically connect a region on the left side of the first gate line GL1 to a region on the right side of the second gate line GL2. Accordingly, the first and second gate lines GL1 and GL2 in a PMOS region may be dummy gate lines, that is, skipped gate lines, which are not real gate lines. In some examples, the first conductive pattern PT1' may cross three or more gate lines GL, and in this case, the second conductive pattern PT2" may extend in the second direction above any of the three or more gate lines GL or between the gate lines GL.

In addition, the second contact jumper CJ2' may cross the first and second gate lines GL1 and GL2 above the second active region AR2 and may be spaced apart from the fourth contact jumper CJ4. In the second active region AR2, the second contact jumper CJ2' may electrically connect a region on the left side of the first gate line GL1 to a region on the right side of the second gate line GL2. Accordingly, the first and second gate lines GL1 and GL2 in an NMOS region may be dummy gate lines, that is, skipped gate lines, which are not real gate lines. In some examples, the second contact jumper CJ2' may cross three or more gate lines GL.

In addition, the integrated circuit 70 may further include a via V0'. The via V0' may be arranged on the second conductive pattern PT2" of the fourth contact jumper CJ4. In an example, the via V0' may be arranged on the second conductive pattern PT2" in a middle region MR. Accordingly, a routing interconnection line, for example, a first metal layer, to be arranged on the via V0' may be arranged above the middle region MR rather than the first active region AR1. However, the position of the via V0' is not limited to the middle region MR, and in some examples, the via V0 is arranged on the second conductive pattern PT2" in the first active region AR1 or the second active region AR2 depending on the length of the second conductive pattern PT2".

Figure 19:
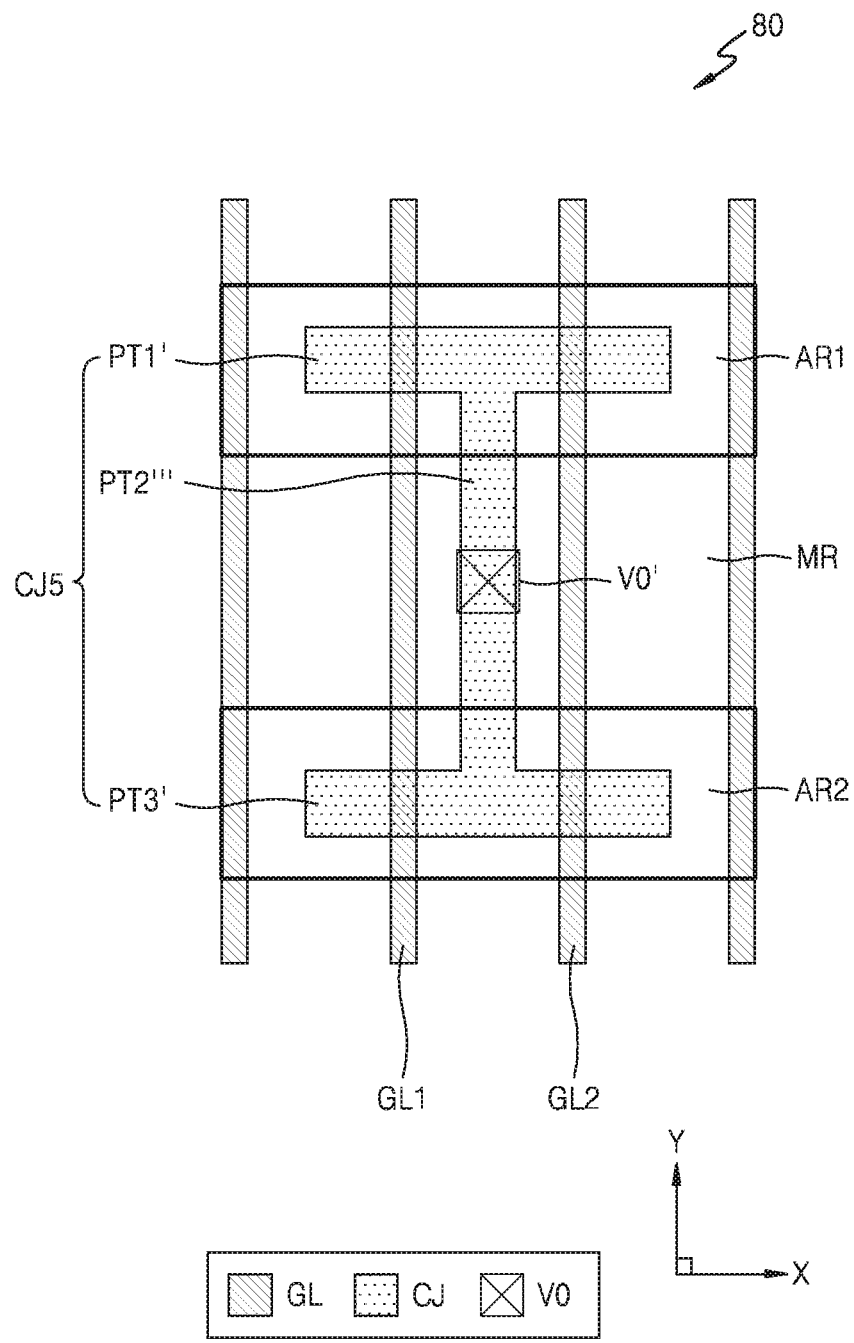

FIG. 19 illustrates a layout of an integrated circuit 80 according to an example.

Referring to FIG. 19, the integrated circuit 80 is similar to the example of the integrated circuit 50 of FIG. 16 but includes first and second active regions AR1 and AR2, a plurality of gate lines GL, and a fifth contact jumper CJ5. The fifth contact jumper CJ5 may include first to third conductive patterns PT1', PT2''', and PT3' connected to each other. The first and third conductive patterns PT1' and PT3' may extend in a first direction (e.g., the X direction), and the second conductive pattern PT2''' may extend in a second direction (e.g., the Y direction).

Specifically, the first conductive pattern PT1' may cross first and second gate lines GL1 and GL2 above the first active region AR1, and the third conductive pattern PT3' may cross the first and second gate lines GL1 and GL2 above the second active region AR2. The second conductive pattern PT2''' may extend in the second direction between the first and second gate lines GL1 and GL2 and may be connected to the first and third conductive patterns PT1' and PT3'. In this manner, the fifth contact jumper CJ5 may have an I-shape or H-shape.

In the first active region AR1, the first conductive pattern PT1' of the fifth contact jumper CJ5 may electrically connect a region on the left side of the first gate line GL1 to a region on the right side of the second gate line GL2. In the second active region AR2, the third conductive pattern PT3' of the fifth contact jumper CJ5 may electrically connect a region on the left side of the first gate line GL1 to a region on the right side of the second gate line GL2. Accordingly, the first and second gate lines GL1 and GL2 may be dummy gate lines, that is, skipped gate lines, which are not real gate lines.

In addition, the integrated circuit 80 may further include a via V0'. The via V0' may be arranged on the second conductive pattern PT2''' of the fifth contact jumper CJ5. In an example, the via V0' may be arranged on the second conductive pattern PT2''' in a middle region MR. Accordingly, a routing interconnection line, for example, a first metal layer, to be arranged on the via V0' may be arranged above the middle region MR rather than the first active region AR1 or the second active region AR2. However, the position of the via V0' is not limited to the middle region MR, and in some examples, the via V0 is arranged on the second conductive pattern PT2''' in the first active region AR1 or the second active region AR2.

Figure 20A:
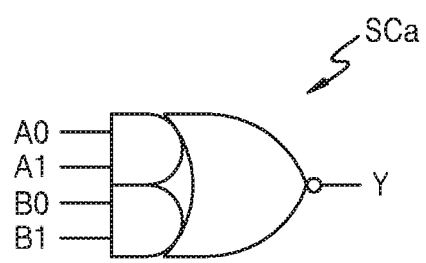
FIG. 20A illustrates a symbol of an example of a standard cell.
Figure 20B:
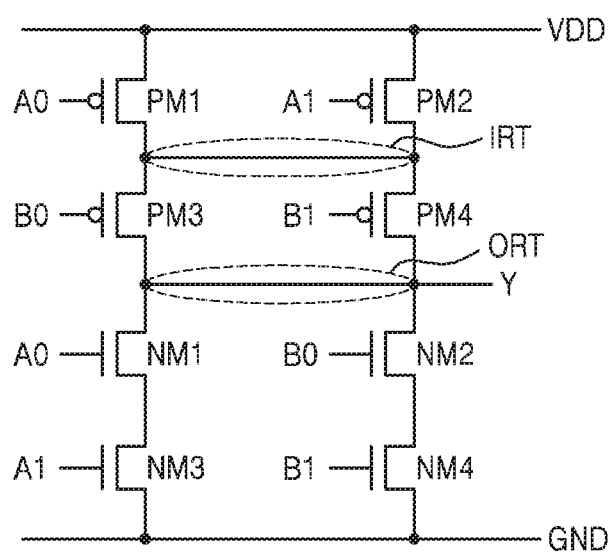
FIG. 20B is a circuit diagram of the standard cell of FIG. 20A.

FIG. 20A illustrates a symbol of a standard cell SCa according to an example, and FIG. 20B is a circuit diagram of the standard cell SCa of FIG. 20A.

Referring to FIG. 20A, the standard cell SCa may be an AOI22 cell and may receive first to fourth input signals A0, A1, B0, and B1 and output one output signal Y. Referring to FIG. 20B, the standard cell SCa may include first to fourth PMOS transistors PM1 to PM4 and first to fourth NMOS transistors NM1 to NM4.

The first PMOS transistor PM1 may include a gate to which the first input signal A0 is applied, and the second PMOS transistor PM2 may include a gate to which the second input signal A1 is applied. The third PMOS transistor PM3 may include a gate to which the third input signal B0 is applied, and the fourth PMOS transistor PM4 may include a gate to which the fourth input signal B1 is applied. In this case, the drain of the first PMOS transistor PM1, the drain of the second PMOS transistor PM2, the source of the third PMOS transistor PM3, and the source of the fourth PMOS transistor PM4 may be electrically connected through an input or internal routing pattern IRT in a PMOS region. In an example, the internal routing pattern IRT may be implemented with a horizontal metal pattern (e.g., a metal pattern M1a in FIG. 21B) extending in a first direction (e.g., the X direction) in a first active region (e.g., an active region AR1 in FIG. 21B) in which the first to fourth PMOS transistors PM1 to PM4 are arranged.

The first NMOS transistor NM1 may include a gate to which the first input signal A0 is applied, and the second NMOS transistor NM2 may include a gate to which the third input signal B0 is applied. The third NMOS transistor NM3 may include a gate to which the second input signal A1 is applied, and the fourth NMOS transistor NM4 may include a gate to which the fourth input signal B1 is applied. In this case, the drain of the third PMOS transistor PM3, the drain of the fourth PMOS transistor PM4, the drain of the first NMOS transistor NM1, and the drain of the second NMOS transistor NM2 may be electrically connected through an output routing pattern ORT that connects the PMOS region and an NMOS region.

In an example, the output routing pattern ORT may include a T-shaped contact jumper (e.g., a contact jumper 110 in FIG. 21A) arranged above the first active region, a contact arranged above a second active region, and an upper metal pattern (e.g., a metal pattern M1b in FIG. 21B) that connects the T-shaped contact jumper and the contact. Accordingly, only one horizontal metal pattern may be arranged above the first active region. Hereinafter, layouts of an integrated circuit including the standard cell SCa will be described with reference to FIGS. 21A to 27. Specifically, various examples of a T-shaped contact jumper for implementing the output routing pattern ORT of the standard cell SCa will be described.

Figure 21A:
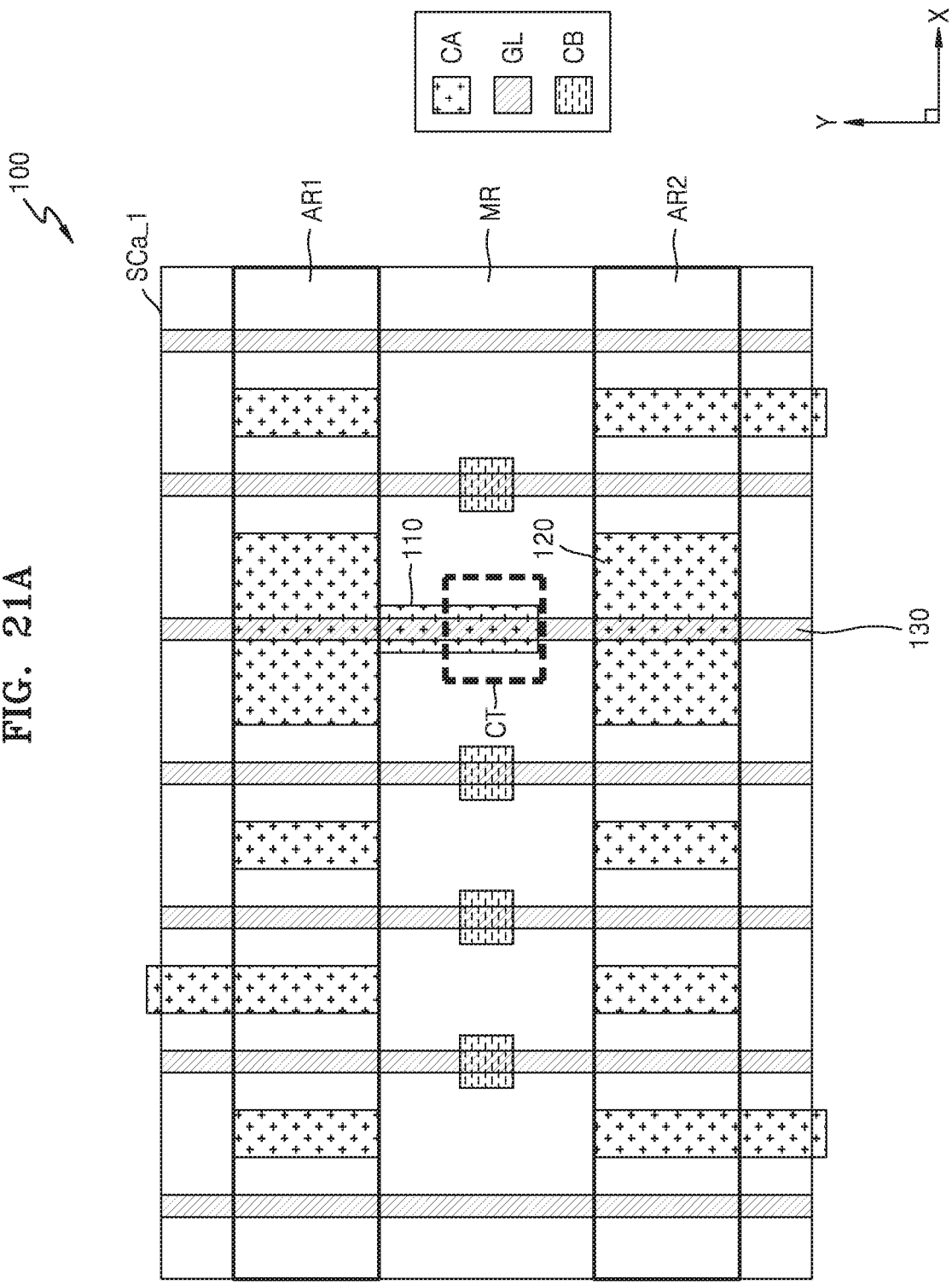
FIG. 21A is a plan view of an example of an integrated circuit according to the inventive concept.

FIG. 21A illustrates a layout of an integrated circuit 100 according to an example.

Referring to FIG. 21A, the integrated circuit 100 may include a standard cell SCa_1 corresponding to the standard cell SCa in FIGS. 20A and 20B, and the standard cell SCa_1 may include first and second active regions AR1 and AR2, a plurality of gate lines GL, and a layer of contacts including first contacts CA and second contacts CB. The first contacts CA may be respectively arranged between the gate lines GL in the first and second active regions AR1 and AR2. The second contacts CB may be respectively arranged on the gate lines GL in a middle region MR. Upper surfaces of the first and second contacts CA and CB may be substantially coplanar at a level above the substrate.

The standard cell SCa_1 may include first and second contact jumpers 110 and 120. For example, the first and second contact jumpers 110 and 120 may be implemented by the first contacts CA. The first contact jumper 110 may include a first portion crossing a first gate line 130 above the first active region AR1 and a second portion extending in a second direction (e.g., the Y direction) above the first gate line 130 in the middle region MR. The second contact jumper 120 may cross the first gate line 130 above the second active region AR2. For example, the first contact jumper 110 may correspond to the first contact jumper CJ1 of FIG. 2A or FIG. 13, and the second contact jumper 120 may correspond to the second contact jumper CJ2 of FIG. 13. The other features/aspects described above with reference to FIGS. 2A and 13 may also be applied to the present example.

In an example, the integrated circuit 100 may further include a cutting region CT. The cutting region CT may be arranged above the first gate line 130 in the middle region MR. Accordingly, even if a short circuit occurs between the first contact jumper 110 and the first gate line 130, a first gate line (i.e., PMOS gate line) above the first active region AR1 may be insulated from a second gate line (i.e., NMOS gate line) above the second active region AR2.

Figure 21B:
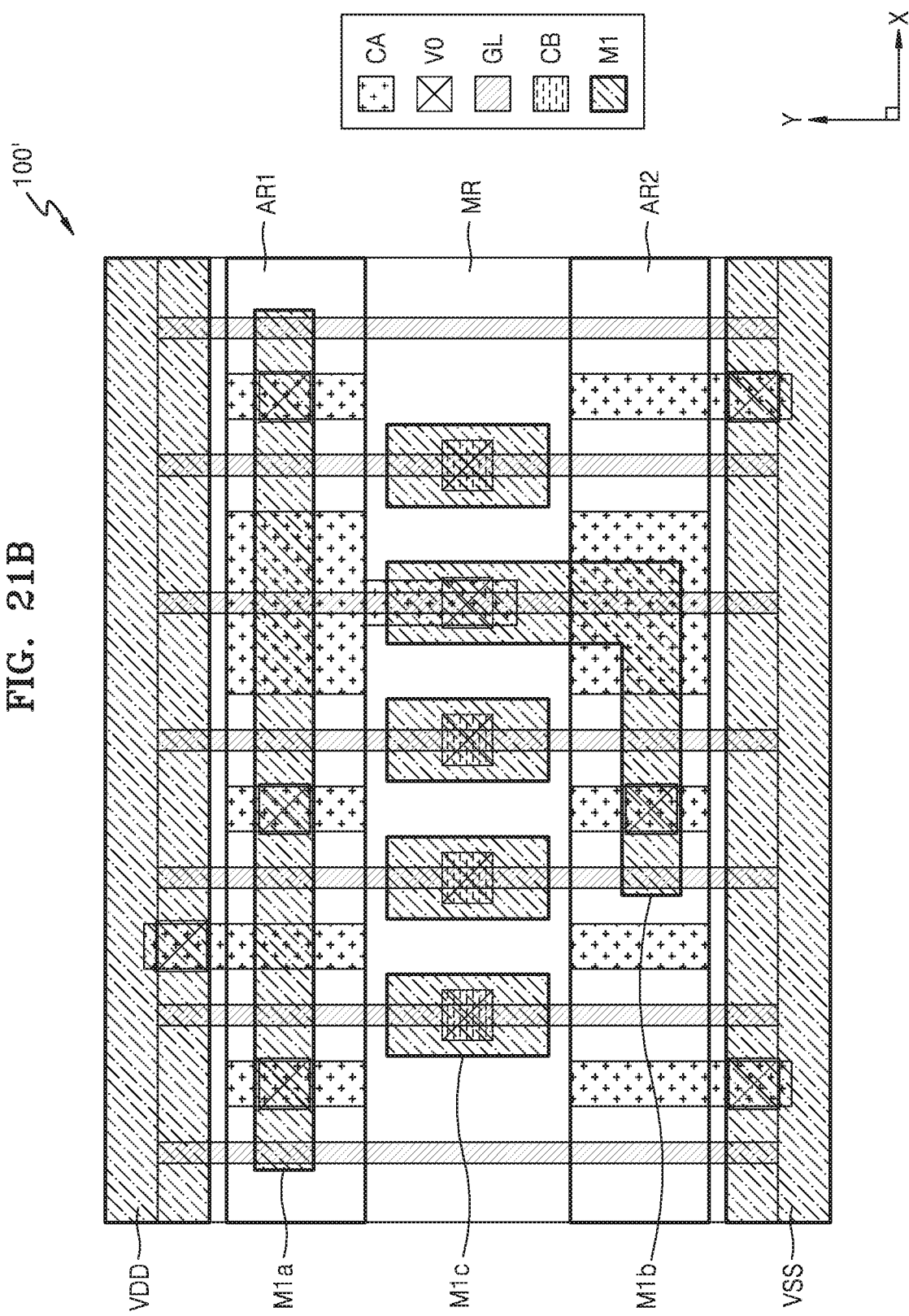
FIG. 21B is a plan view of an example of an integrated circuit further including a first metal layer as compared to the example of FIG. 21A.

FIG. 21B illustrates a layout of an integrated circuit 100' further including a first metal layer M1 as compared to FIG. 21A, according to an example.

Referring to FIG. 21B, the integrated circuit 100' may further include first vias V0 and a first metal layer M1 on the first vias V0. The first vias V0 may be part of a first layer of vias arranged on the layer of contacts including the first contacts CA and second contacts CB. The first vias V0 may be aligned with each other in a middle region MR. For example, the first vias V0 may be arranged in a straight line in a first direction (e.g., the X direction) in the middle region MR.

The first metal layer M1 is disposed on the first layer of vias and may be a referred to as a first metallization layer. The first metal layer M1 may include a first metal pattern M1a connecting first vias V0 arranged in a first active region AR1 to each other, a second metal pattern M1b connecting first vias V0 arranged in a second active region AR2 to each other, and third metal patterns M1c respectively connected to first vias V0 arranged in the middle region MR. The first metal layer M1 may further include a power supply voltage pattern VDD and a ground voltage pattern VSS.

According to the present example, only one horizontal metal track, that is, the first metal pattern M1a may be arranged above the first active region AR1 and only one horizontal metal track, that is, the second metal pattern M1b, may be arranged above the second active region AR2. Because there is no horizontal metal track extending beyond the first active region AR1, the second contacts CB and the first vias V0 arranged in the middle region MR may be arranged in an aligned position. In addition, the second contacts CB may be implemented in the same pattern, and the first vias V0 may also be implemented in the same pattern. Thus, as patterns in the integrated circuit 100' are simplified, a process risk may be reduced and the number of design rule violations may be reduced in a design rule check stage.

Figure 21C:
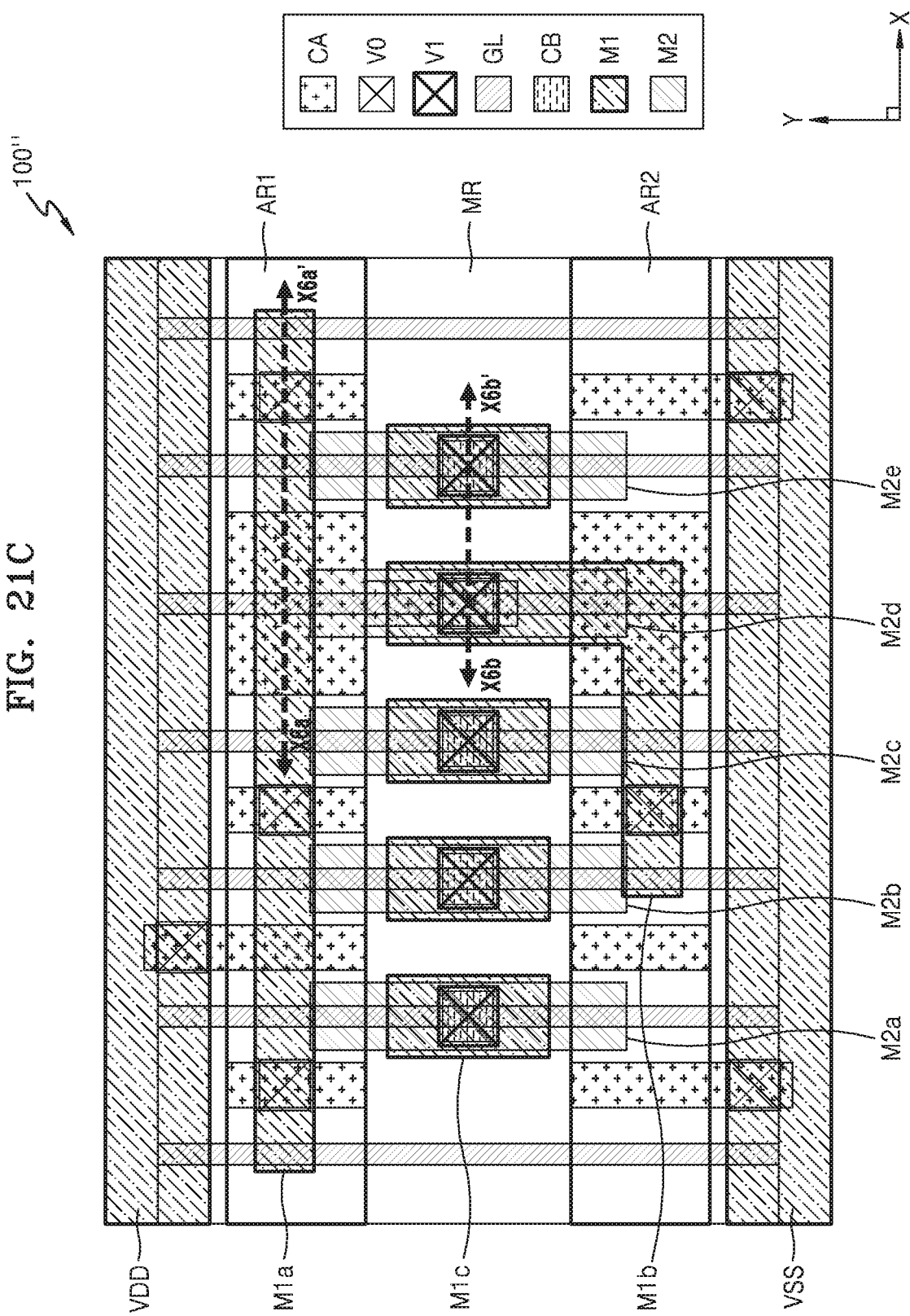
FIG. 21C is a plan view of an example of an integrated circuit further including a second metal layer compared to the example of FIG. 21B.
Figure 22:
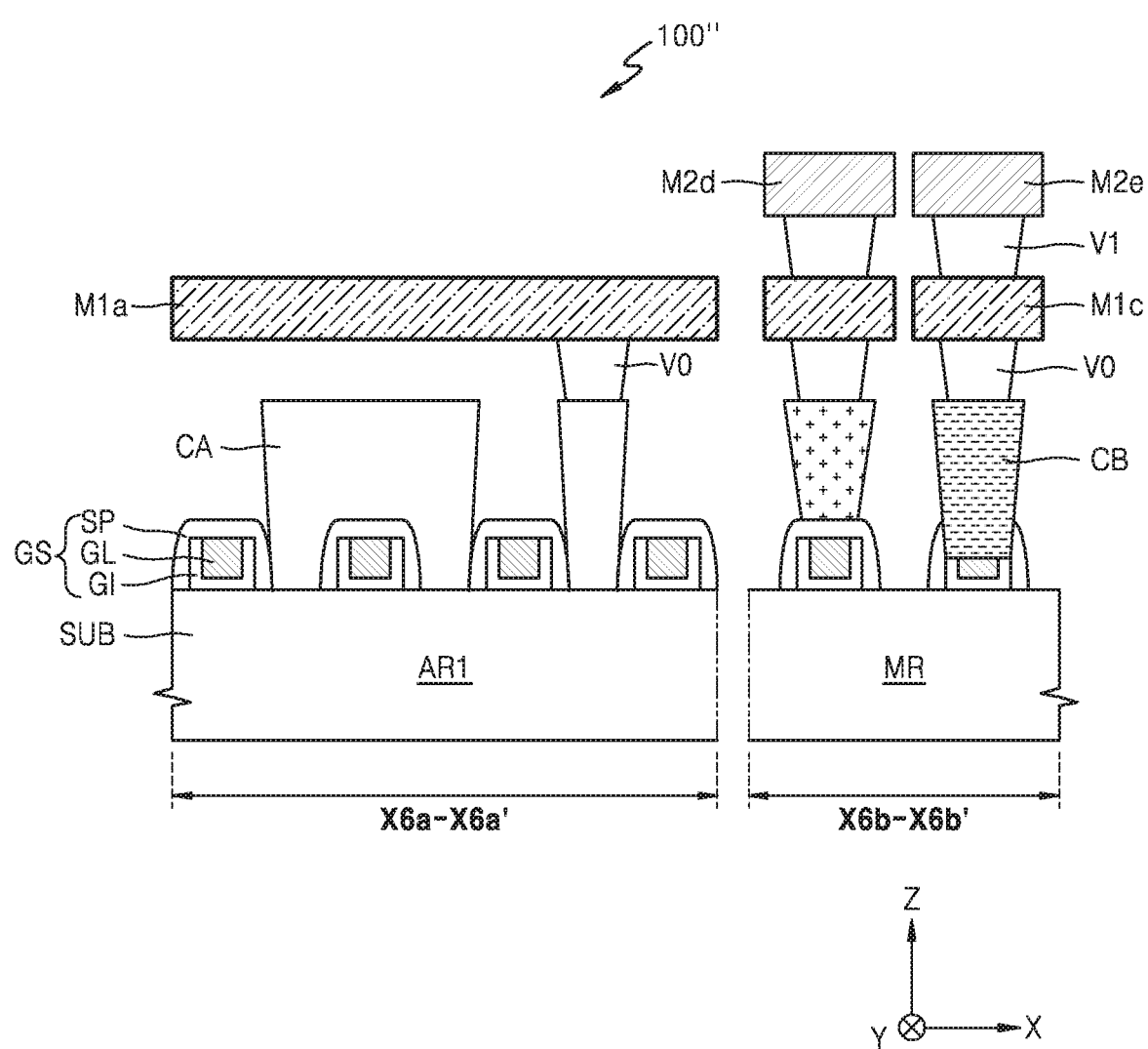
FIG. 22 is a cross-sectional view taken along lines X6a-X6a' and X6b-X6b' in FIG. 21C.

FIG. 21C illustrates a layout of an integrated circuit 100" further including a second metal layer compared to FIG. 21B, according to an example. FIG. 22 is a cross-sectional view taken along lines X6a-X6a' and X6b-X6b' in FIG. 21C.

Referring to FIGS. 21C and 22, the integrated circuit 100" may further include second vias V1 (i.e., a second layer of vias on the first metallization layer M1) and a second metal layer M2 (i.e, a second metallization layer) on the second (layer of) vias V1. The second vias V1 may be arranged on a third metal patterns M1c of first metal layer M1 in a middle region MR. The second vias V1 may be aligned with each other in the middle region MR. For example, the second vias V1 may be arranged in a straight line in a first direction (e.g., the X direction) in the middle region MR.

The second metal layer M2 may include a plurality of metal patterns M2a to M2e. In an example, the metal patterns M2a to M2e may be the same pattern, i.e., may have the same shapes and sizes. For example, the widths of the plurality of metal patterns M2a to M2e in the first direction may be equal to each other. In addition, for example, the lengths of the plurality of metal patterns M2a to M2e in a second direction (e.g., the Y direction) may be equal to each other. For example, the metal patterns M2a, M2b, M2c, and M2e may correspond to input routing patterns, i.e., metal input terminals, to which first to fourth input signals A0, A1, B0, and B1 are applied, and the metal pattern M2d may correspond to an output routing pattern ORT in FIG. 20B, i.e., a metal output terminal, from which an output signal Y is output.

Figure 23A:
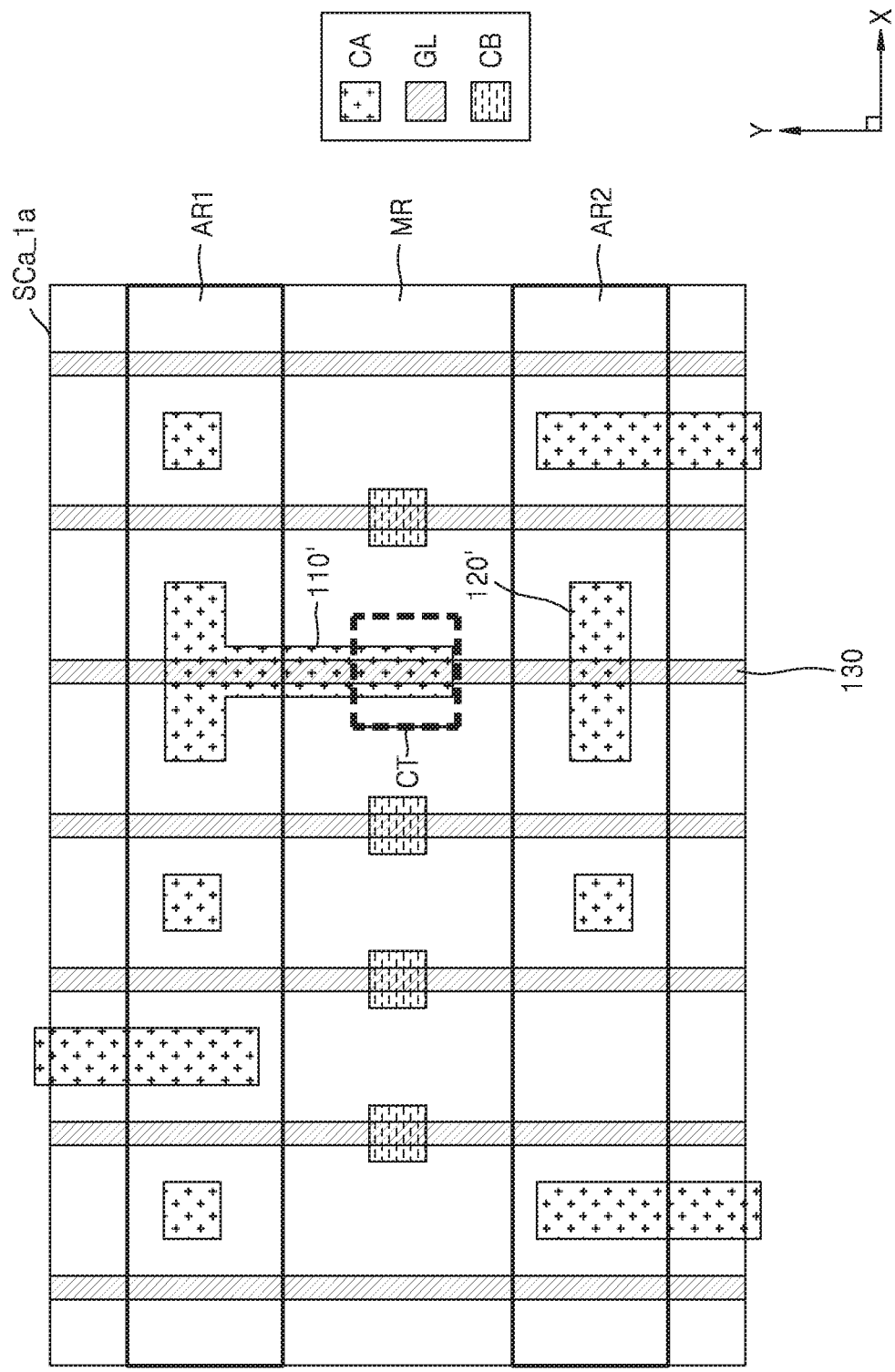
FIG. 23A is a plan view of an example of an integrated circuit according to the inventive concept
Figure 23B:
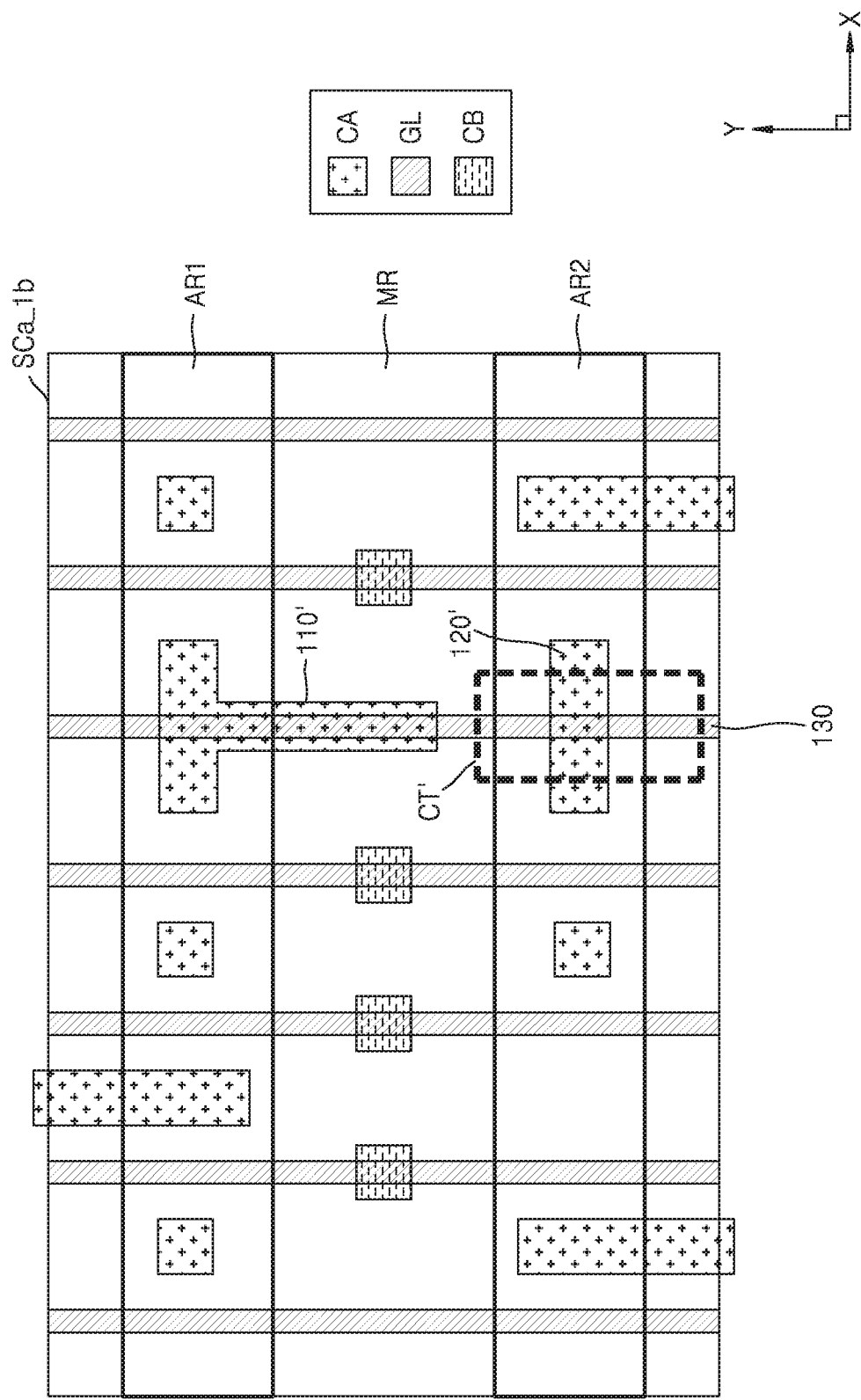
FIG. 23B is a plan view of an example of an integrated circuit according to the inventive concept.

FIGS. 23A and 23B illustrate integrated circuits 100a and 100b as other examples of the integrated circuit 100 of FIG. 21A, respectively.

Referring to FIG. 23A, the integrated circuit 100a is similar to the example of the integrated circuit 100 of FIG. 21A. The integrated circuit 100a may include a standard cell SCa_1a, and first contacts CA of the standard cell SCa_1a may be respectively arranged between gate lines GL in first and second active regions AR1 and AR2. The lengths of some of the first contacts CA in a second direction (e.g., the Y direction) may be less than those of the first contacts CA of FIG. 21A. In an example, a cutting region CT may be arranged above a first gate line 130 in a middle region MR. Referring to FIG. 23B, the integrated circuit 100b is similar to the example of the integrated circuit 100a of FIG. 23A. The integrated circuit 100b may include a standard cell SCa_1b, and a cutting region CT' of the standard cell SCa_1b may be arranged above the first gate line 130 in the second active region AR2.

Figure 24A:
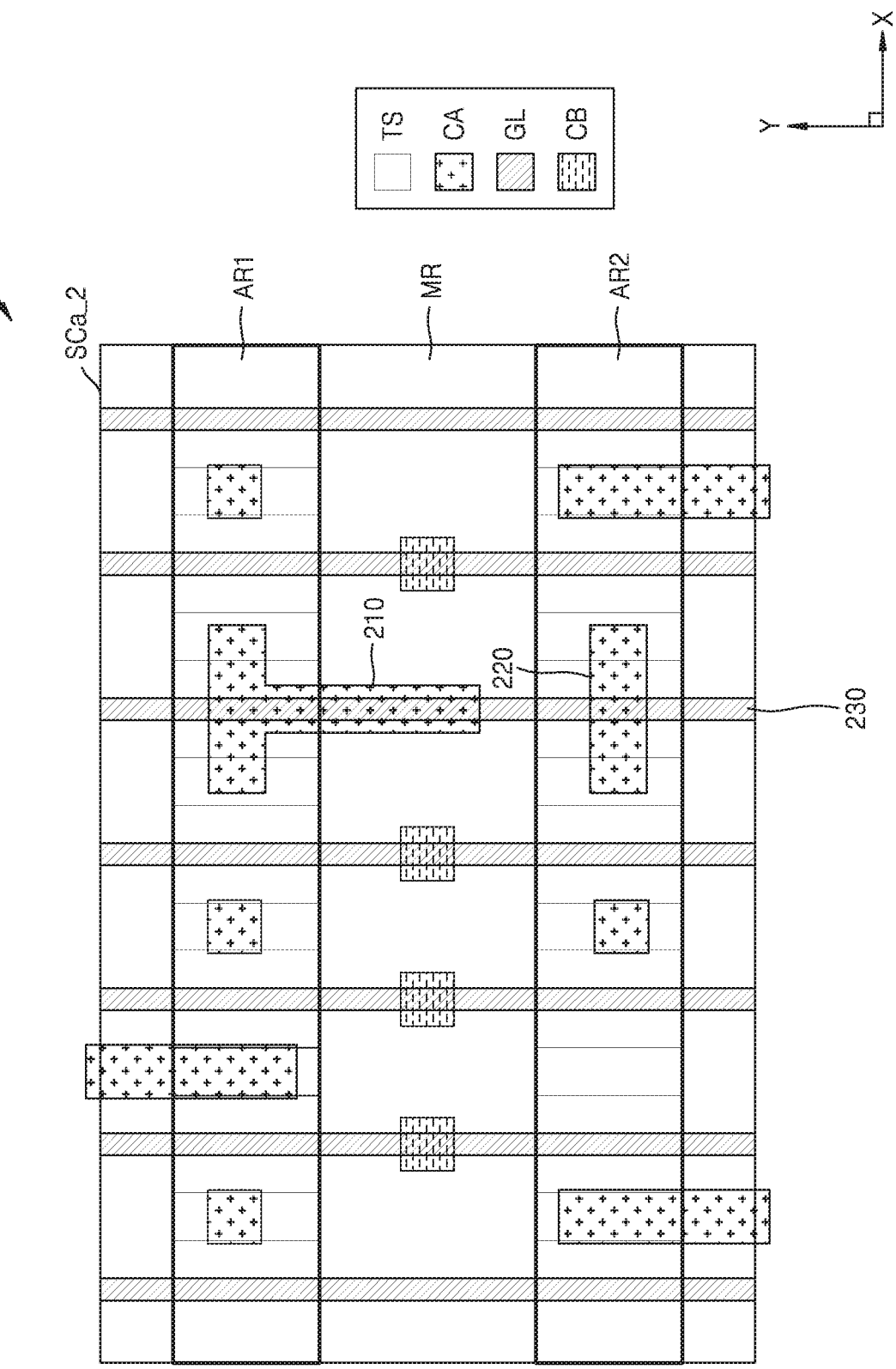
FIG. 24A is a plan view of an example of an integrated circuit according to the inventive concept.

FIG. 24A illustrates a layout of an integrated circuit 200 according to an example.

Referring to FIG. 24A, the integrated circuit 200 may include a standard cell SCa_2 corresponding to the standard cell SCa in FIGS. 20A and 20B. The standard cell SCa_2 may include first and second active regions AR1 and AR2, a plurality of gate lines GL, trench silicides TS, first contacts CA, and second contacts CB. The trench silicides TS may be respectively arranged between the gate lines GL in the first and second active regions AR1 and AR2. The lengths of the trench silicides TS in a second direction (e.g., the Y direction) may be substantially equal to the lengths of the first and second active regions AR1 and AR2 in the second direction. The first contacts CA may be respectively arranged on the trench silicides TS in the first and second active regions AR1 and AR2. The second contacts CB may be respectively arranged on the gate lines GL in a middle region MR.

The standard cell SCa_2 may include first and second contact jumpers 210 and 220. For example, the first and second contact jumpers 210 and 220 may be implemented by first contacts CA. The first contact jumper 210 may include a first portion crossing a first gate line 230 in the first active region AR1 and a second portion extending in the second direction above the first gate line 230 in the middle region MR. The second contact jumper 220 may cross the second gate line 230 in the second active region AR2. For example, the first contact jumper 210 may correspond to the first contact jumper CJ1 of FIG. 6 or 13, and the second contact jumper 220 may correspond to the second contact jumper CJ2 of FIG. 13. The other features/aspects of the examples described above with reference to FIGS. 6, 7, and 13 may also be applied to the present example.

Figure 24B:
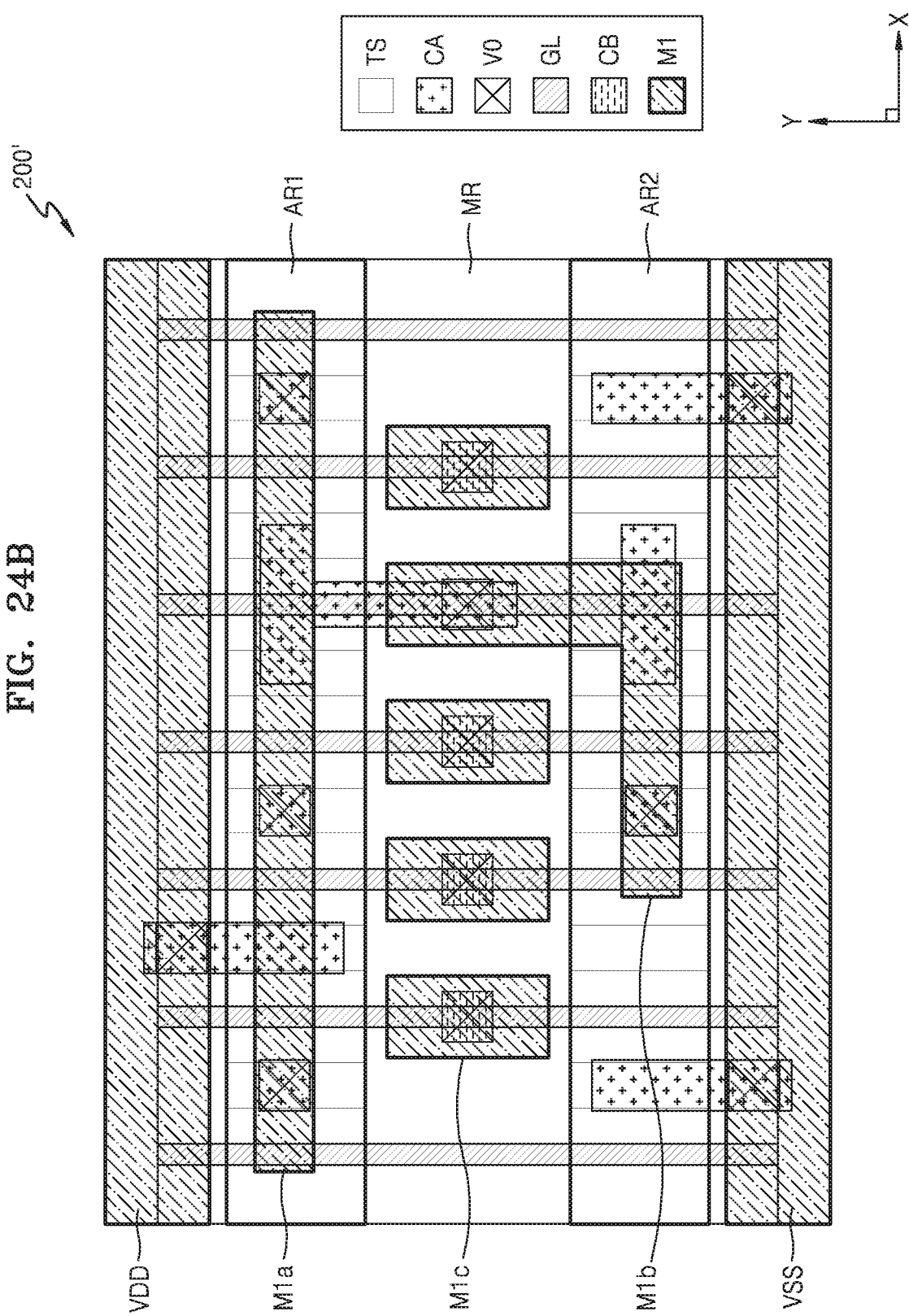
FIG. 24B is a plan view of an example of an integrated circuit according to the inventive concept and including a first metal layer as compared to the example of FIG. 24A.

FIG. 24B illustrates a layout of an integrated circuit 200' further including a first metal layer M1 as compared to FIG. 24A, according to an example. Referring to FIG. 24B, the integrated circuit 200' may further include first vias V0 and a first metal layer M1 on the first vias V0. The first vias V0 and the first metal layer M1 may be implemented in substantially the same manner as described with reference to the example illustrated in FIG. 21B, and thus will not be described again in detail.

Figure 24C:
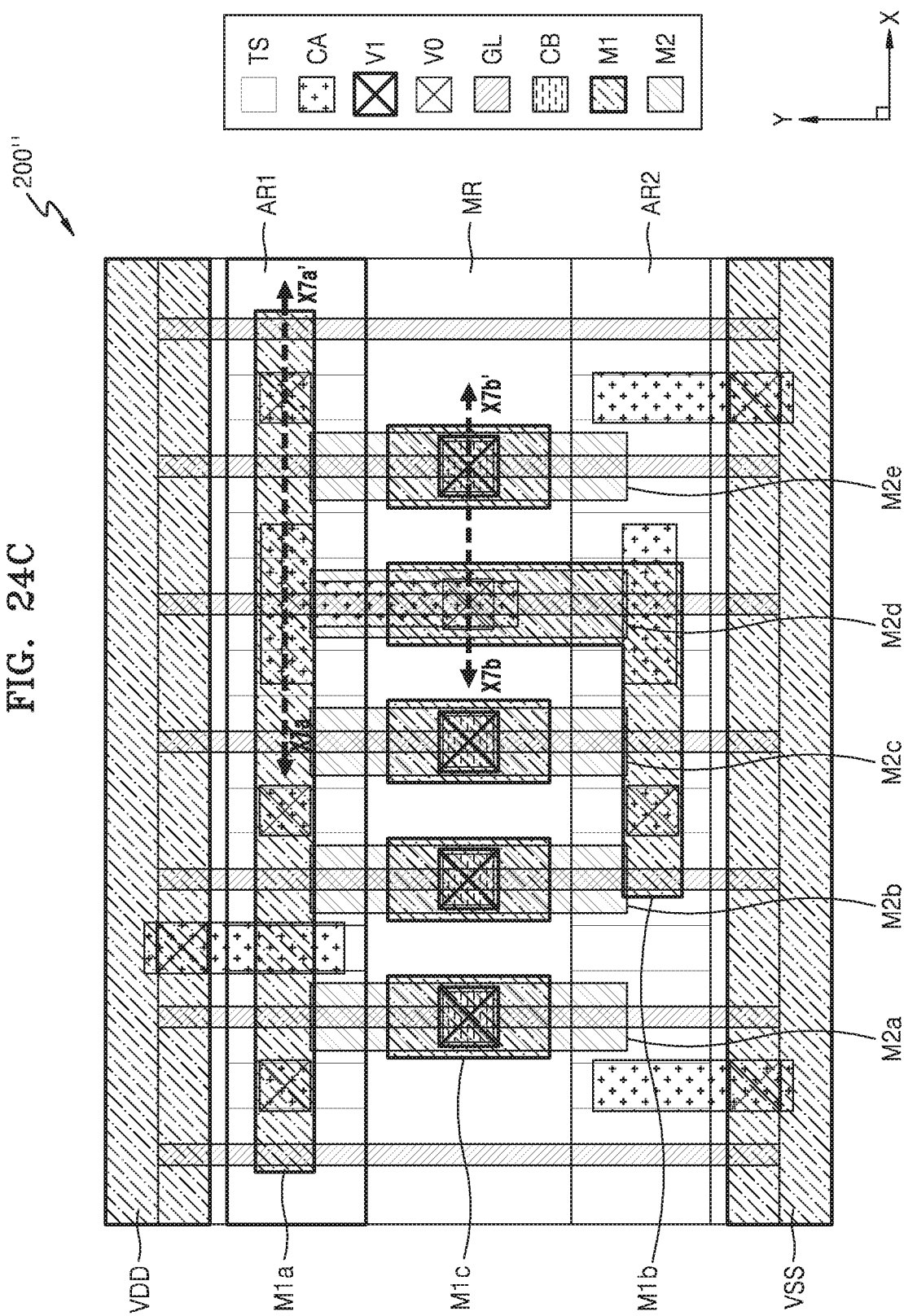
FIG. 24C is a plan view of an example of an integrated circuit according to the inventive concept and further including a second metal layer as compared to the example of FIG. 24B.
Figure 25:
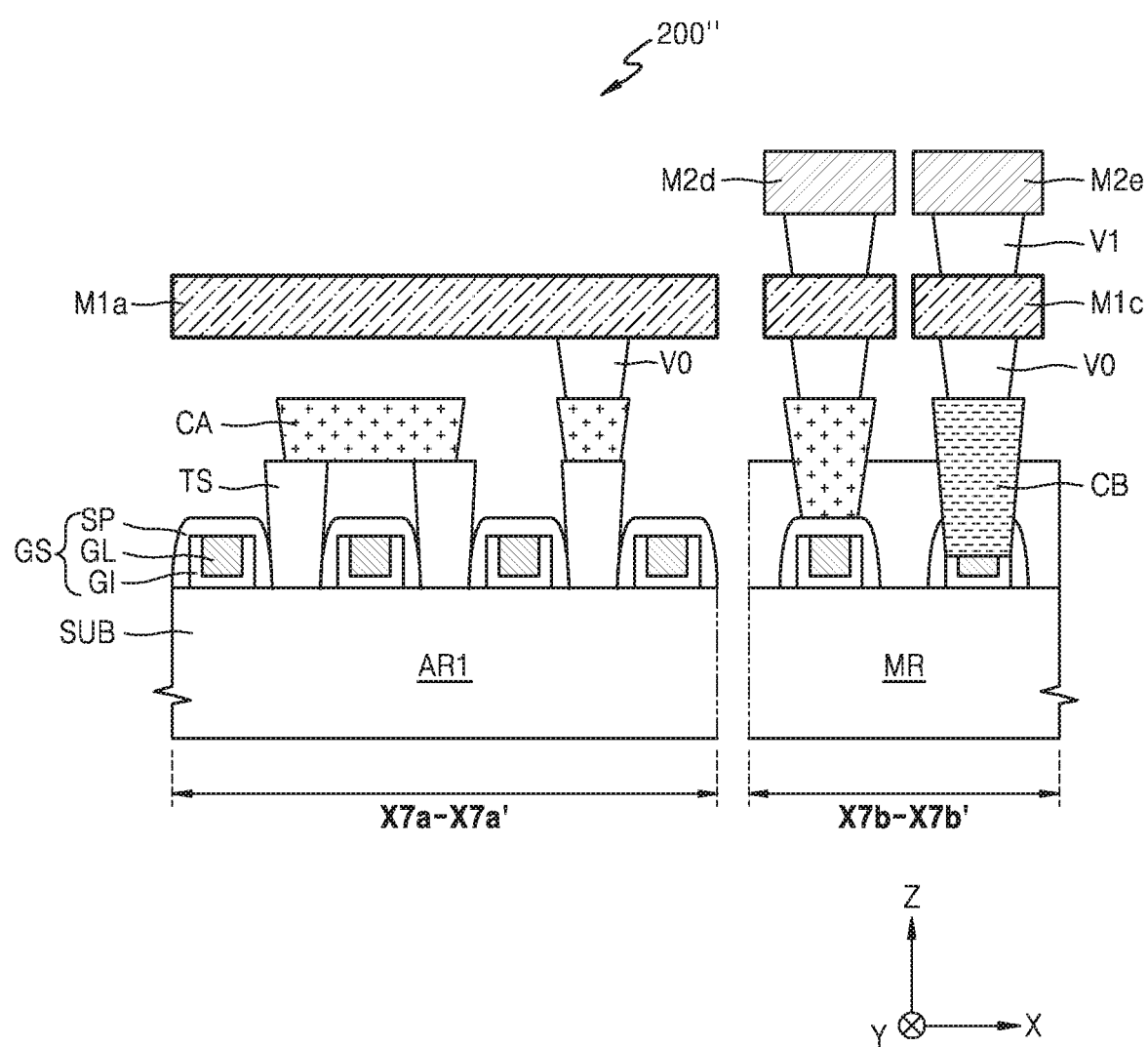
FIG. 25 is a cross-sectional view taken along lines X7a-X7a' and X7b-X7b' in FIG. 24C.

FIG. 24C illustrates a layout of an integrated circuit 200" further including a second metal layer M2 as compared to FIG. 24B, according to an example. FIG. 25 is a cross-sectional view taken along lines X7a-X7a' and X7b-X7b' in FIG. 24C. Referring to FIGS. 24C and 25, the integrated circuit 200" may further include second vias V1 and a second metal layer M2 on the second vias V1. The second vias V1 and the second metal layer M2 may be implemented in substantially the same manner as described with reference to the example illustrated in FIG. 21C, and thus will not be described again in detail.

Figure 26A:
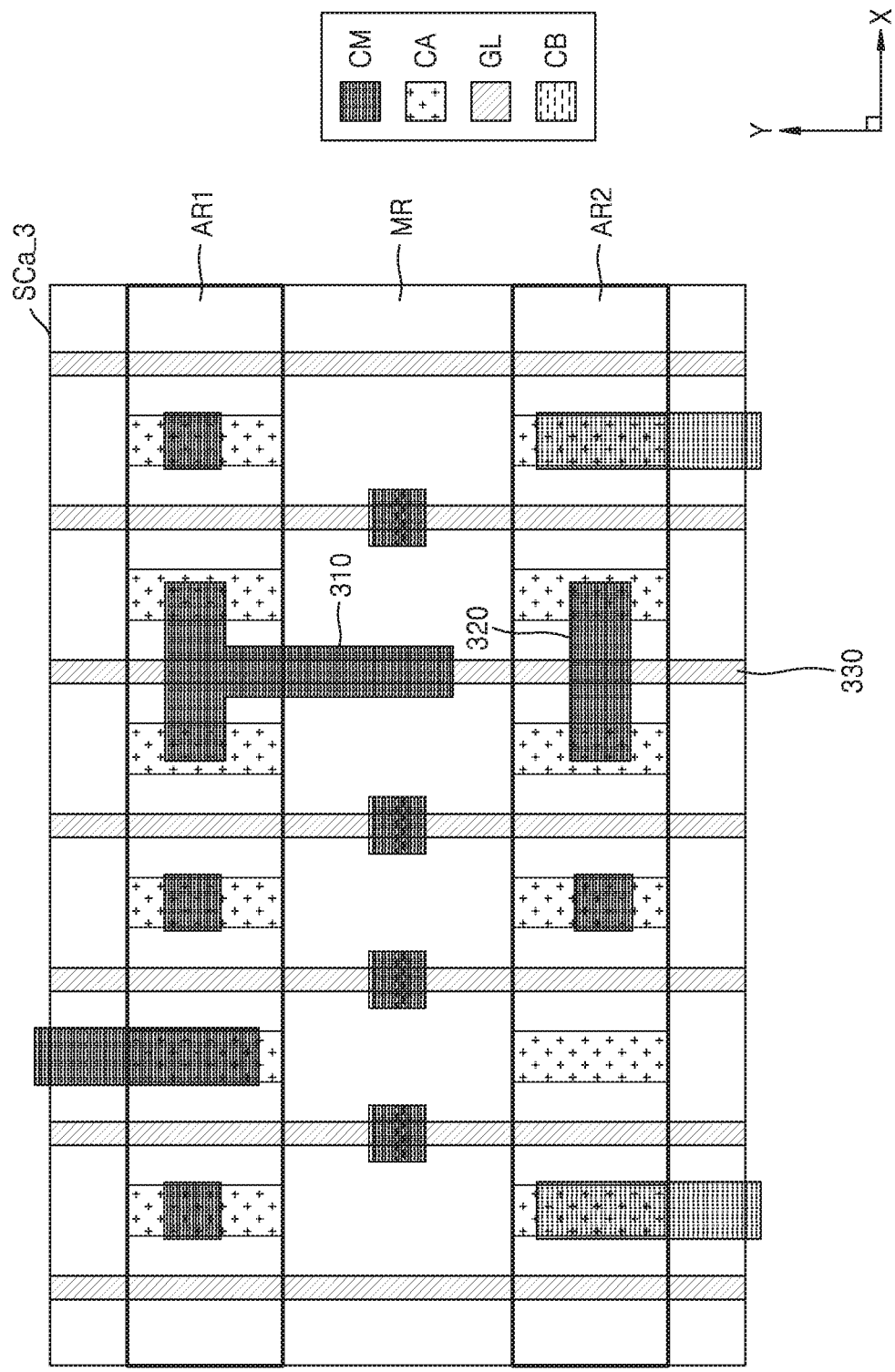
FIG. 26A is a plan view of an example of an integrated circuit according to the inventive concept.

FIG. 26A illustrates a layout of an integrated circuit 300 according to an example.

Referring to FIG. 26A, the integrated circuit 300 may include a standard cell SCa_3 corresponding to the standard cell SCa in FIGS. 20A and 20B, and the standard cell SCa_3 may include first and second active regions AR1 and AR2, a plurality of gate lines GL, first contacts CA, second contacts CB, and third contacts CM. The first contacts CA may be respectively arranged between the gate lines GL in the first and second active regions AR1 and AR2. The second contacts CB may be respectively arranged on the gate lines GL in a middle region MR. The third contacts CM may be arranged on some of the first contacts CA and some of the second contacts CB.

The standard cell SCa_3 may include first and second contact jumpers 310 and 320. For example, the first and second contact jumpers 310 and 320 may be implemented by the third contacts CM. The first contact jumper 310 may include a first portion crossing a first gate line 330 in the first active region AR1 and a second portion extending in a second direction (e.g., the Y direction) above the first gate line 330 in the middle region MR. The second contact jumper 320 may cross the first gate line 330 in the second active region AR2. For example, the first contact jumper 310 may correspond to the first contact jumper CJ1 of FIG. 8, 11, or 13, and the second contact jumper 320 may correspond to the second contact jumper CJ2 of FIG. 13. Other aspects/features of the example described above with reference to FIGS. 8 to 13 may also be applied to the present example.

Figure 26B:
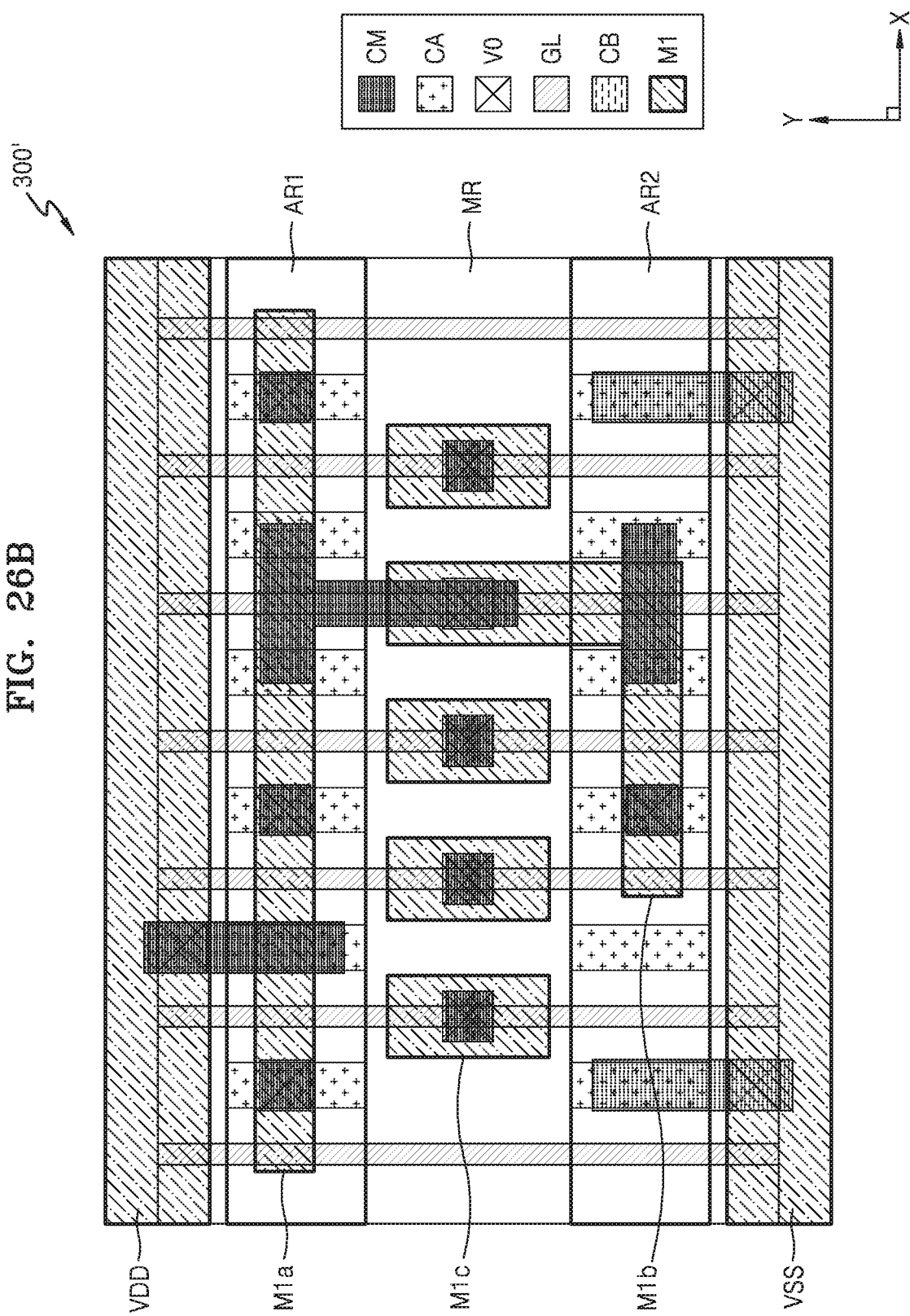
FIG. 26B is a plan view of an example of an integrated circuit according to the inventive concept and further including a first metal layer as compared to the example of FIG. 26A.

FIG. 26B illustrates a layout of an integrated circuit 300' further including a first metal layer M1 as compared to FIG. 26A, according to an example. Referring to FIG. 26B, the integrated circuit 300' may further include first vias V0 and a first metal layer M1 on the first vias V0. The first vias V0 may be arranged on third contacts CM. The first vias V0 may be implemented in substantially the same manner as the example illustrated in FIG. 21B, and repeated descriptions thereof are omitted.

Figure 26C:
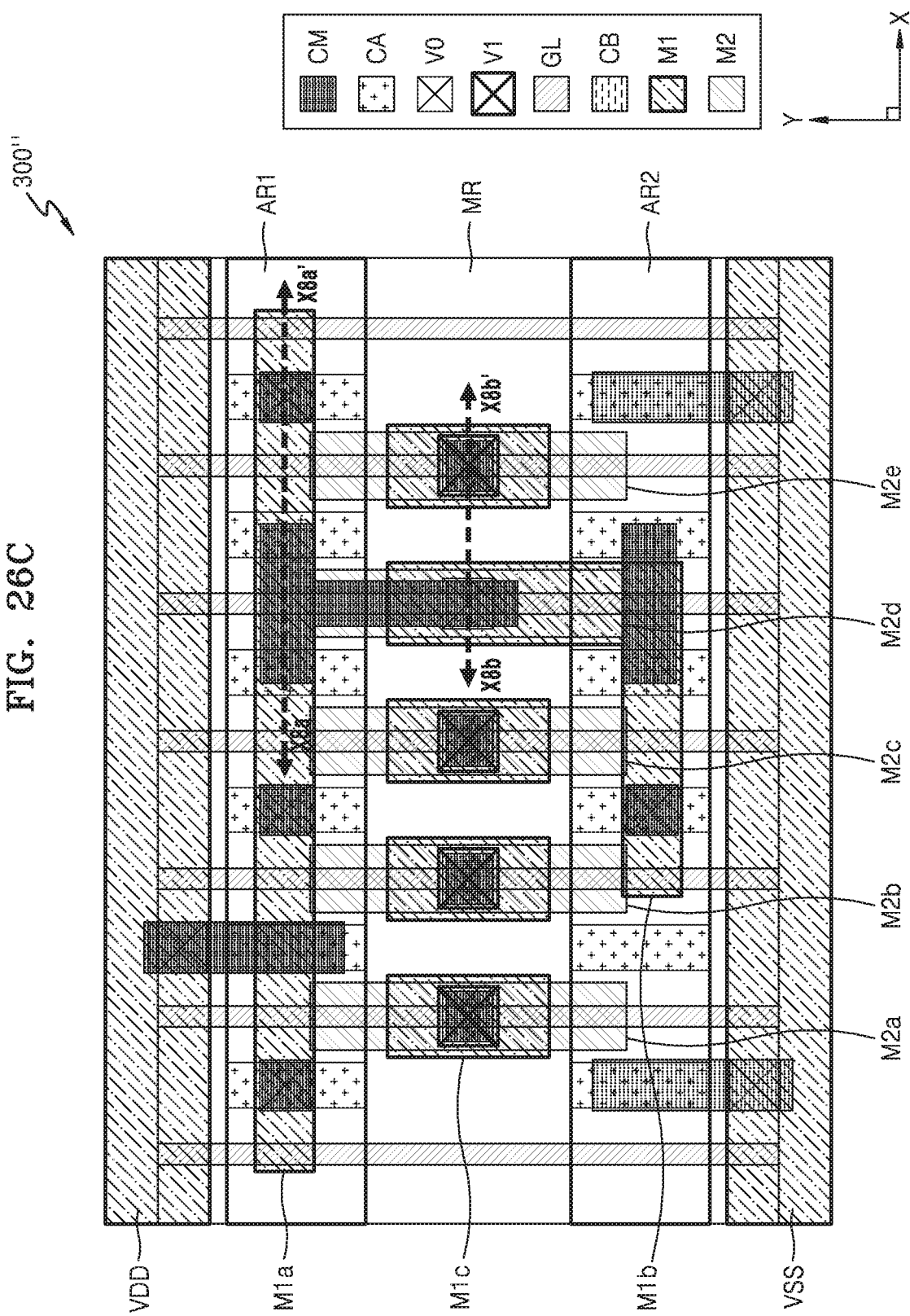
FIG. 26C is a plan view of an example of an integrated circuit according to the inventive concept and further including a second metal layer as compared to the example of FIG. 26B.
Figure 27:
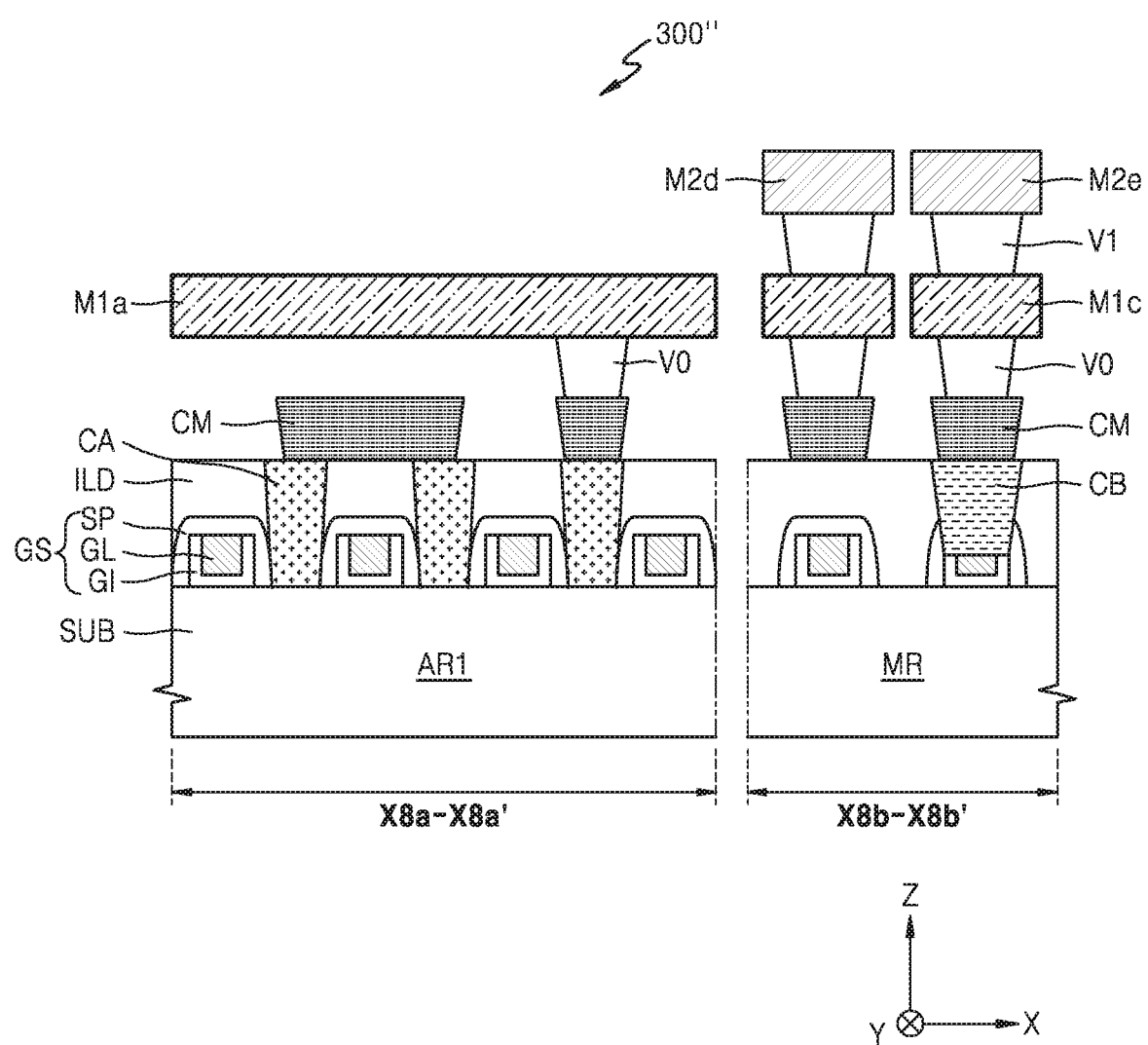
FIG. 27 is a cross-sectional view taken along lines X8a-X8a' and X8b-X8b' in FIG. 26C.

FIG. 26C illustrates a layout of an integrated circuit 300" further including a second metal layer M2 as compared to FIG. 26B, according to an example. FIG. 27 is a cross-sectional view taken along lines X8a-X8a' and X8b-X8b' in FIG. 26C. Referring to FIGS. 26C and 27, the integrated circuit 300" may further include second vias V1 and a second metal layer M2 on the second vias V1. The second vias V1 and the second metal layer M2 may be implemented in substantially the same manner as that described with reference to the example illustrated in FIG. 21C, and thus will not be described again in detail.

Figure 28A:
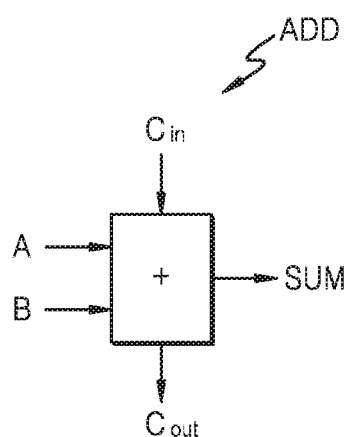
FIG. 28A illustrates a symbol of an adder.
Figure 28B:
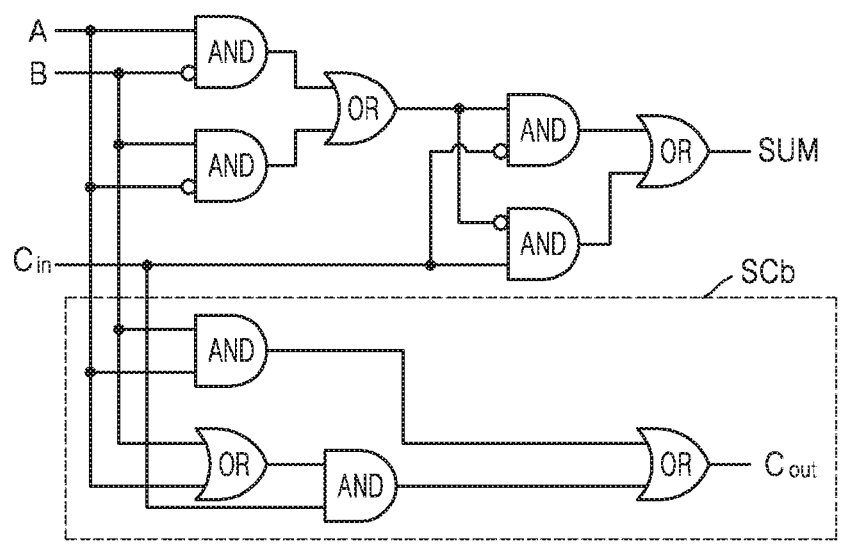
FIG. 28B is a logic circuit diagram of an adder including a standard cell.

FIG. 28A illustrates a symbol of an adder ADD, and FIG. 28B is a logic circuit diagram of an adder ADD including a standard cell SCb according to an example.

Figure 29A:
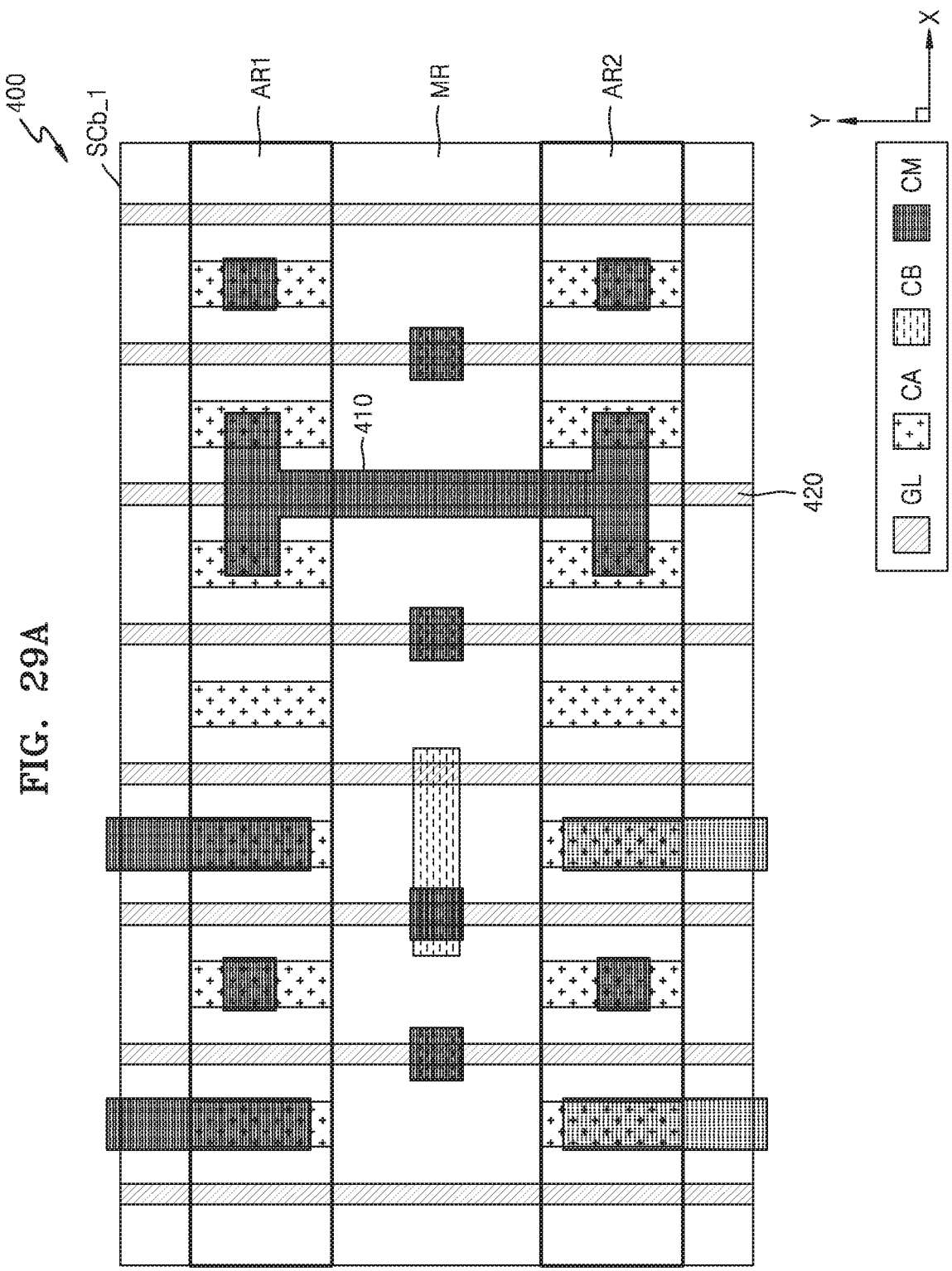
FIG. 29A is a plan view of an example of an integrated circuit according to the inventive concept.
Figure 29B:
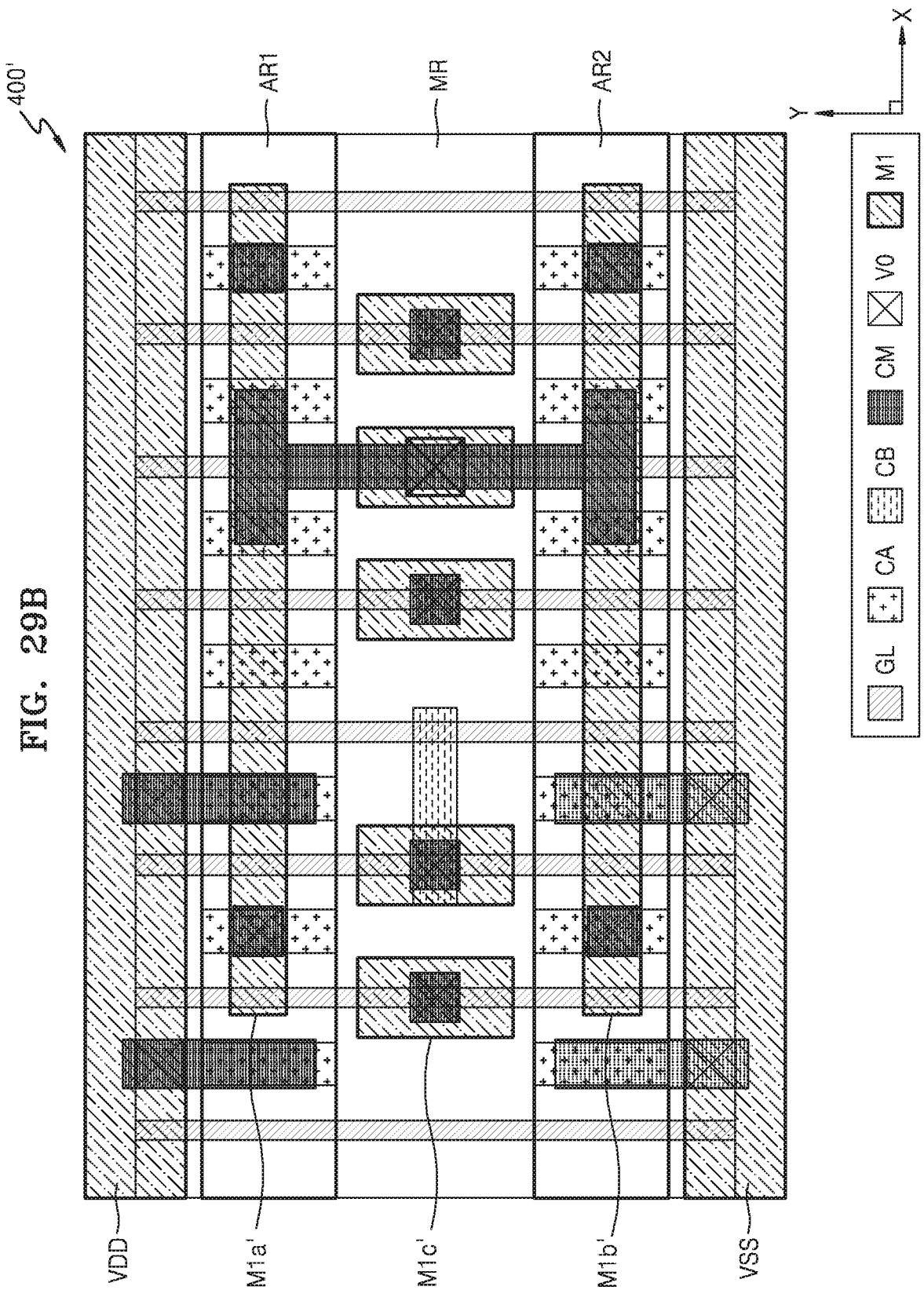
FIG. 29B is a plan view of an example of an integrated circuit according to the inventive concept and further including a first metal layer as compared to the example of FIG. 29A.

Referring to FIGS. 28A and 29B, the adder ADD may include a carry-out cell, and the carry-out cell may be implemented by the standard cell SCb. The standard cell SCb may receive first to third input signals A, B, and Cin and output an output signal Cout. Hereinafter, layouts of an integrated circuit including the standard cell SCb will be described with reference to FIGS. 29A to 29C. Specifically, various examples of a contact jumper for implementing an output routing of the standard cell SCb will be described.

FIG. 29A illustrates a layout of an integrated circuit 400 according to an example.

Referring to FIG. 29A, the integrated circuit 400 may include a standard cell SCb_1 corresponding to the standard cell SCb in FIG. 28B, and the standard cell SCb_1 may include first and second active regions AR1 and AR2, a plurality of gate lines GL, first contacts CA, second contacts CB, and third contacts CM. The first contacts CA may be respectively arranged between the gate lines GL in the first and second active regions AR1 and AR2. The second contacts CB may be respectively arranged on the gate lines GL in a middle region MR. The third contacts CM may be arranged on some of the first contacts CA and some of the second contacts CB.

The standard cell SCb_1 may include a contact jumper 410. For example, the contact jumper 410 may be implemented by the third contact CM. The contact jumper 410 may include a first portion crossing a first gate line 420 in the first active region AR1, a second portion extending in a second direction (e.g., the Y direction) above the first gate line 420 in the middle region MR, and a third portion crossing the first gate line 420 in the second active region AR2 and connected to the second portion. For example, the contact jumper 410 may correspond to the third contact jumper CJ3 of FIG. 16. Other aspects/features of the example described above with reference to FIG. 16 may also be applied to the present example.

FIG. 29B illustrates a layout of an integrated circuit 400' further including a first metal layer M1 as compared to FIG. 29A, according to an example.

Referring to FIG. 29B, the integrated circuit 400' may further include first vias V0 and a first metal layer M1 on the first vias V0. The first vias V0 may be arranged on third contacts CM. The first vias V0 may be aligned with each other in a middle region MR. For example, the first vias V0 may be arranged in a straight line in a first direction (e.g., the X direction) in the middle region MR.

The first metal layer M1 may include a first metal pattern M1a' connecting first vias V0 arranged in a first active region AR1 to each other, a second metal pattern M1b' connecting first vias V0 arranged in a second active region AR2 to each other, and third metal patterns M1c' respectively connected to first vias V0 arranged in the middle region MR. The first metal layer M1 may further include a power supply voltage pattern VDD and a ground voltage pattern VSS.

According to the present example, only one horizontal metal track, that is, the first metal pattern M1a' may be arranged above the first active region AR1 and only one horizontal metal track, that is, the second metal pattern M1b', may be arranged above the second active region AR2. Accordingly, the number of horizontal metal patterns in a standard cell may be limited to two, i.e., two horizontal metal patterns are sufficient. If the integrated circuit 400' did not include the contact jumper 410, the standard cell would require four horizontal metal patterns. In addition, according to the present example, there is no horizontal metal track extending beyond the first active region AR1. Accordingly, the second contacts CB, the third contacts CM, and the first vias V0 arranged in the middle region MR may be arranged in an aligned position. The second contacts CB may be implemented in the same pattern, and the first vias V0 may also be implemented in the same pattern.

According to the present example, the widths of the third metal patterns M1c' in the first direction may be equal to each other. In addition, the lengths of the third metal patterns M1c' in the second direction may be equal to each other. In this manner, the third metal patterns M1c' may be the same pattern and may be aligned with each other. For example, the third metal patterns M1c' may be arranged in a straight line in the first direction.

Figure 29C:
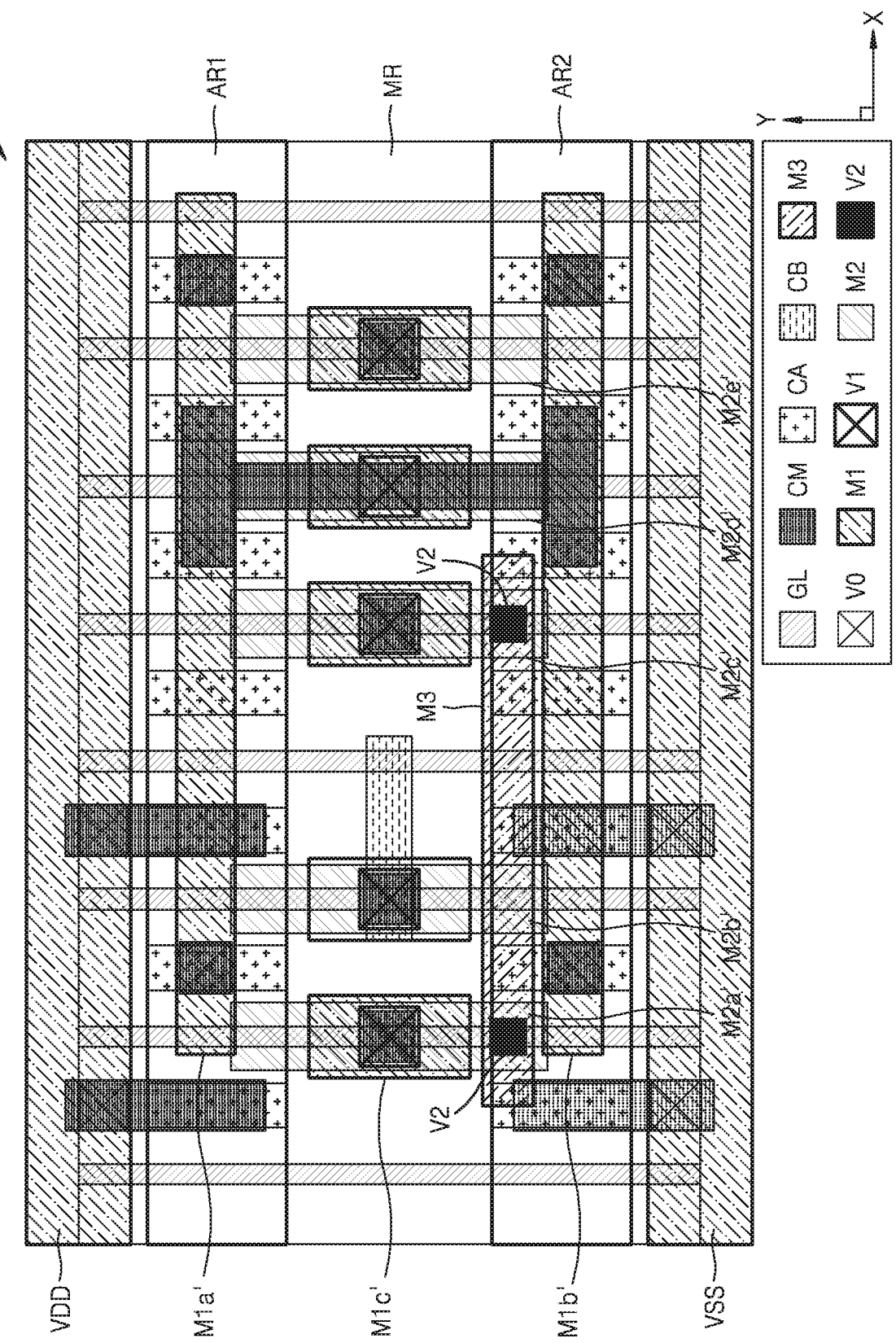
FIG. 29C is a plan view of an example of an integrated circuit according to the inventive concept and further including a second metal layer as compared to the example of FIG. 29B.

FIG. 29C illustrates a layout of an integrated circuit 400" further including a second metal layer M2 as compared to FIG. 29B, according to an example.

Referring to FIG. 29C, the integrated circuit 400" may further include second vias V1 and the second metal layer M2 on the second vias V1. The second vias V1 may be arranged on a first metal layer M1 in a middle region MR. The second vias V1 may be aligned with each other in the middle region MR. For example, the second vias V1 may be arranged in a straight line in a first direction (e.g., the X direction) in the middle region MR. In addition, the second vias V1 may be implemented in the same pattern.

The second metal layer M2 may include a plurality of metal patterns M2a' to M2e'. In an example, the metal patterns M2a' to M2e' may be the same pattern. For example, the widths of the plurality of metal patterns M2a' to M2e' in the first direction may be equal to each other. In addition, the lengths of the plurality of metal patterns M2a' to M2e' in a second direction (e.g., the Y direction) may be equal to each other. In an example, the metal patterns M2a', M2b', M2c', and M2e' may correspond to input routing patterns. For example, a first input signal A may be applied to the metal patterns M2a' and M2c', a second input signal B may be applied to the metal pattern M2b', and a third input signal Cin may be applied to the metal pattern M2e'. In an example, the metal pattern M2d' may correspond to an output routing pattern. For example, an output signal Cout may be output from the metal pattern M2d'.

The integrated circuit 400" may further include third vias V2 and a third metal layer M3 on the third vias V2. The third vias V2 may be respectively arranged on the metal patterns M2a' and M2c' of the second metal layer M2. The third metal layer M3 may extend in the first direction, and may be arranged on the third vias V2 so that the metal patterns M2a' and M2c' may be electrically connected to each other.

Figure 30:
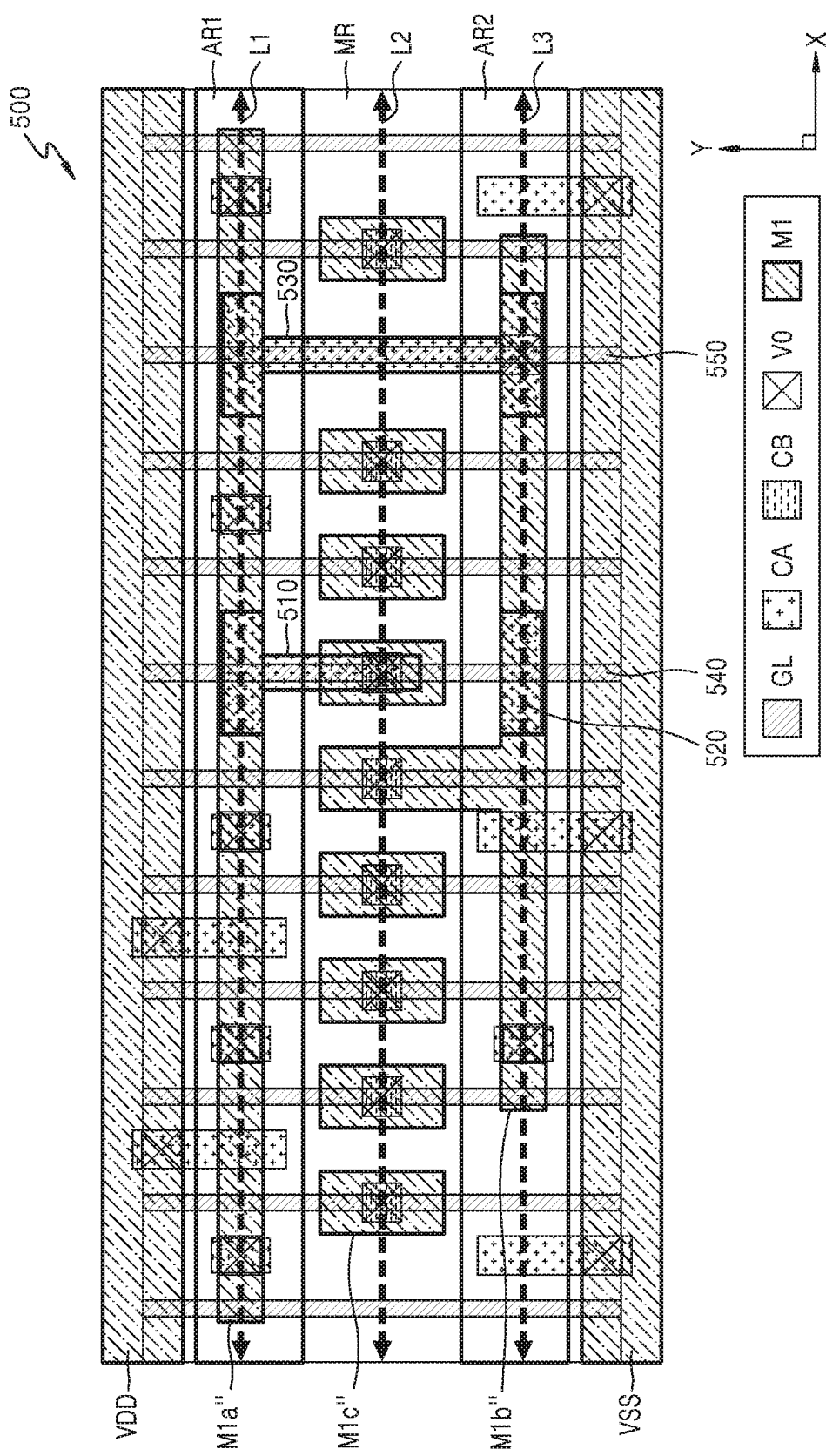
FIG. 30 is a plan view of an example of an integrated circuit according to the inventive concept.

FIG. 30 illustrates a layout of an integrated circuit 500 according to an example.

Referring to FIG. 30, the integrated circuit 500 may include first and second active regions AR1 and AR2, a plurality of gate lines GL, first to third contact jumpers 510 to 530, first vias V0, and a first metal layer M1. In an example, the first to third contact jumpers 510 to 530 may be implemented using the first contacts CA, as illustrated in FIGS. 2A and 3. In an example, the first to third contact jumpers 510 to 530 may be implemented using a first contact CA and a second contact CB, as illustrated in FIGS. 4 and 5. In an example, the first to third contact jumpers 510 to 530 may be implemented using trench silicides, a first contact CA, and/or a second contact CB, as illustrated in FIGS. 6 and 7. In an example, the first to third contact jumpers 510 to 530 may be implemented using first contacts CA and a third contact CM, as illustrated in FIGS. 8 to 10.

The first contact jumper 510 may have a T-shape including a first portion crossing a first gate line 540 above the first active region AR1 and a second portion extending in a second direction (e.g., the Y direction) above the first gate line 540 and connected to the first portion. The second contact jumper 520 may cross the first gate line 540 above the second active region AR2. Accordingly, the first gate line 540 may be a dummy gate line.

The third contact jumper 530 may have an I-shape including a first portion crossing a second gate line 550 above the first active region AR1, a second portion crossing the second gate line 550 above the second active region AR2, and a third portion extending in the second direction above the second gate line 550 and connected to the first and second portions. Accordingly, the second gate line 550 may be a dummy gate line.

In an example, first contacts CA arranged above the first active region AR1 may be aligned with each other along a first line L1. In an example, second contacts CB arranged above a middle region MR may be aligned with each other along a second line L2. In an example, first contacts CA arranged above the second active region AR2 may be aligned with each other along a third line L3.

The first vias V0 may be arranged on some of the first contacts CA and on some of the second contacts CB. In an example, the first vias V0 may be formed with patterns of the same shape. In an example, first vias V0 arranged above the first active region AR1 may be aligned with each other along the first line L1. In an example, first vias V0 arranged above the middle region MR may be aligned with each other along the second line L2. In an example, first vias V0 arranged above the second active region AR2 may be aligned with each other along the third line L3.

The first metal layer M1 may include a first metal pattern M1$a$" extending in a first direction above the first active region AR1, a second metal pattern M1$b$" extending in the first direction above the second active region AR2, and third metal patterns M1$c$" extending in the second direction above the middle region MR. Accordingly, the number of horizontal metal patterns in the standard cell may be limited to two. The first metal pattern M1$a$" may connect first contacts CA on the first active region AR1 to each other, the second metal pattern M1$b$" may connect first contacts CA on the second active region AR2 to each other, and the third metal patterns M1$c$" may be connected to second contacts CB on the middle region MR, respectively. In an example, third metal patterns M1$c$" arranged above the second contacts CB from among the third metal patterns M1$c$" may have the same height in the second direction.

Figure 31:
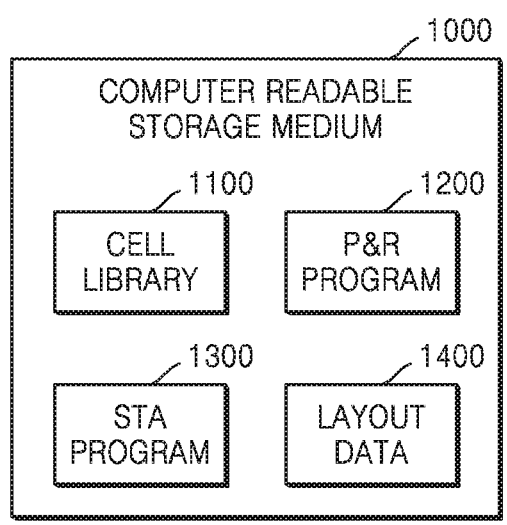
FIG. 31 is a block diagram of a storage medium that may include an integrated circuit according to the inventive concept.

FIG. 31 illustrates a storage medium 1000 according to an example.

Referring to FIG. 31, the storage medium 1000 may store a cell library 1100, a placement and routing (P&R) program 1200, a static timing analysis (STA) program 1300, and layout data 1400. The storage medium 1000 may be a computer-readable storage medium and may include any storage medium that may be read by a computer during use to provide instructions and/or data to the computer. For example, the storage medium 1000 may include a magnetic or optical medium such as a disk, a tape, a CD-ROM, a DVD-ROM, a CD-R, a CD-RW, a DVD-R, or DVD-RW, a volatile or non-volatile memory such as RAM, ROM, or a flash memory, a non-volatile memory accessible through a USB interface, and microelectromechanical systems (MEMS). The computer-readable storage medium may be embedded in a computer, integrated into a computer, or coupled to a computer through a communication medium such as a network and/or a wireless link.

The cell library 1100 may be a standard cell library and may include information regarding a standard cell that is a unit constituting an integrated circuit. In an example, the information regarding a standard cell may include layout information for layout generation. In an example, the information regarding a standard cell may include timing information for layout verification or simulation. Specifically, the cell library 1100 may include layout information regarding the standard cells described above with reference to FIGS. 1 to 30.

The P&R program 1200 may include instructions for performing placement and routing of standard cells by using the cell library 1100. The STA program 1300 may include instructions for performing STA, and the STA is a simulation method of calculating expected timing of a digital circuit and may perform a timing analysis on all timing paths of arranged standard cells and output timing analysis results. The layout data 1400 may include physical information regarding a layout generated through placement and routing operations.

And as is traditional in the field, the illustrated blocks which carry out the function or functions, as described above, may be physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the example may be physically separated into two or more interacting and discrete blocks without departing from the scope of the inventive concept. Likewise, the blocks of the example may be physically combined into more complex blocks without departing from the scope of the inventive concept.

Figure 32:
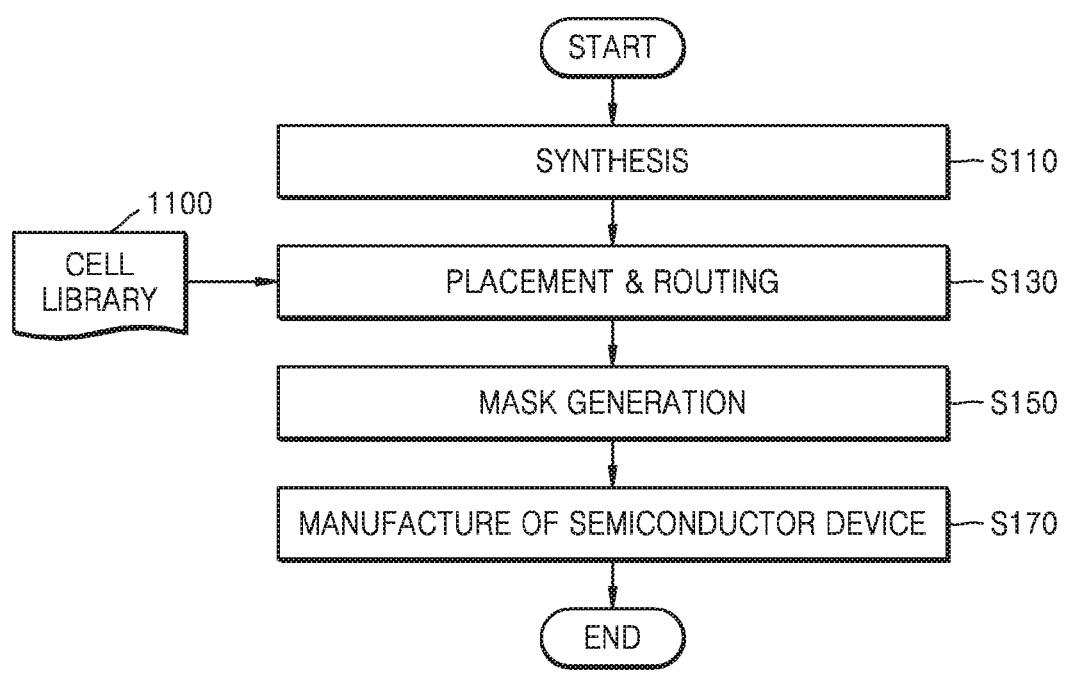
FIG. 32 is a flowchart illustrating an example of a method of manufacturing a semiconductor device according to the inventive concept.

FIG. 32 is a flowchart illustrating a method of manufacturing a semiconductor device, according to an example.

Referring to FIG. 32, the method of manufacturing a semiconductor device may be divided into a design of an integrated circuit and a manufacturing process of the integrated circuit. The design of the integrated circuit includes Operations S110 and S130, and the manufacturing process of the integrated circuit includes Operations S150 and S170 that are operations of manufacturing a semiconductor device according to the integrated circuit based on layout data, and may be performed by a semiconductor manufacturing module.

In Operation S110, a synthesis operation is performed. For example, Operation S110 may be performed by a processor by using a synthesis tool. Specifically, a gate-level netlist may be generated by synthesizing input data, defined in a register transfer level (RTL), with respect to an integrated circuit by using a standard cell library (e.g., the standard cell library 1100 in FIG. 31).

In Operation S130, layout data for the integrated circuit is generated by placing and routing standard cells that define the integrated circuit according to the netlist. For example, Operation S130 may be performed by the processor by using a P&R tool. For example, the layout data may be graphic design system (GDS) II format data. Specifically, as illustrated in FIGS. 1 to 30, the layout data may be generated by placing standard cells having reduced (i.e., relatively small) heights and including contact jumpers, thereby minimizing the total size (footprint) of the integrated circuit. After Operation S130, a parasitic component extraction operation, an STA operation, and the like may be further performed.

In Operation S150, a mask(s) is/are generated based on the layout data. Specifically, an optical proximity correction (OPC) may be performed based on the layout data. The OPC refers to a process of changing a layout by reflecting errors due to an optical proximity effect. Then, a mask(s) may be manufactured according to a layout changed according to the result of the OPC. In this case, a mask(s) may be manufactured by using a layout reflecting the OPC, for example, a GDS II in which the OPC is reflected.

In Operation S170, a semiconductor device in which the integrated circuit is implemented is manufactured using a mask(s). Specifically, various semiconductor processes are performed on a semiconductor substrate such as a wafer by using a plurality of masks to form a semiconductor device in which the integrated circuit is implemented. For example, a process using a mask may refer to a patterning process through a lithographic process. Through the patterning process, a desired pattern may be formed on a semiconductor substrate or a material layer. The semiconductor process may include a deposition process, an etching process, an ion process, a cleaning process, and the like. Also, the semiconductor process may include a packaging process in which a semiconductor device is mounted on a printed circuit board (PCB) and sealed with a sealing material, and may include a test process of testing a semiconductor device or package.

Figure 33:
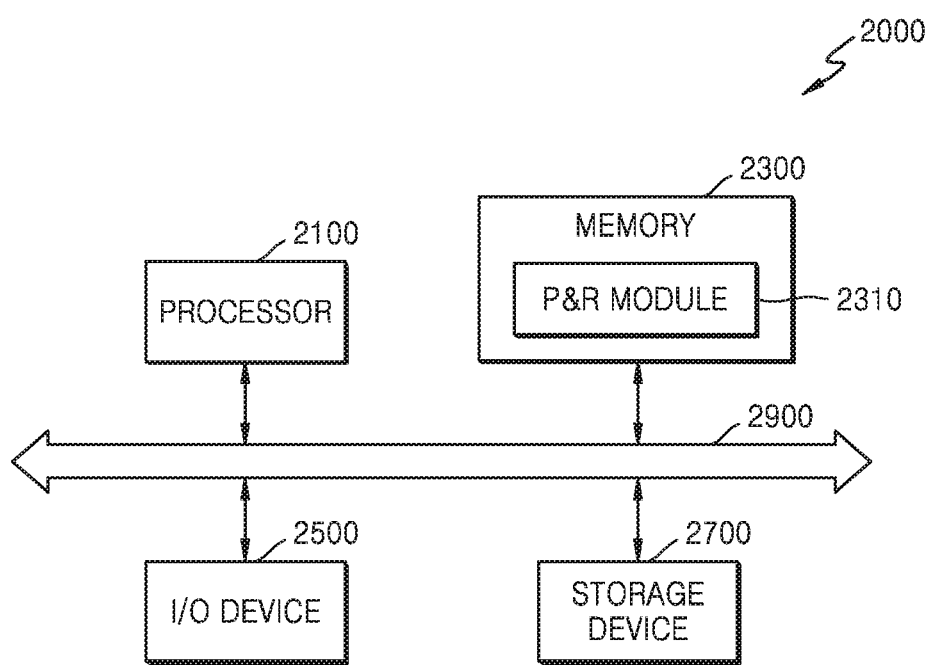
FIG. 33 is a block diagram of an integrated circuit design system configured to design integrated circuits according to the inventive concept.

FIG. 33 is a block diagram of an integrated circuit design system 2000 according to an example.

Referring to FIG. 33, the integrated circuit design system 2000 may include a processor 2100, a memory 2300, an input/output (I/O) device 2500, a storage device 2700, and a bus 2900. The integrated circuit design system 2000 may be provided as a dedicated apparatus for designing an integrated circuit of a semiconductor device, but may also be a computer for driving various simulation tools or design tools.

The processor 2100 may be configured to execute instructions that perform at least one of various operations for designing an integrated circuit. The processor 2100 may communicate with the memory 2300, the I/O device 2500, and the storage device 2700 via the bus 2900. The processor 2100 may execute an operation of generating layout data of the integrated circuit by driving a P&R module 2310 loaded in the memory 2300. The memory 2300 may store the P&R module 2310. In addition, the memory 2300 may further store a synthesis module, a parasitic component extraction module, and/or a timing analysis module. The P&R module 2310 may be loaded from the storage device 2700 into the memory 2300. The memory 2300 may be a volatile memory such as SRAM or DRAM, or a nonvolatile memory such as PRAM, MRAM, ReRAM, FRAM, or a NOR flash memory.

The I/O device 2500 may control user input and output from user interface devices. For example, the I/O device 2500 may include an input device such as a keyboard, a mouse, or a touch pad to receive input data defining an integrated circuit. The storage device 2700 may store various data related to the P&R module 2310. The storage device 2700 may include a memory card (MMC, eMMC, SD, MicroSD, etc.), a solid state drive (SSD), and/or a hard disk drive (HDD).

Although the inventive concept has been particularly shown and described with reference to examples thereof, it will be understood that various changes in form and details may be made to such examples without departing from the spirit and scope of the inventive concept as defined by the following claims.

What is claimed is:

1. An integrated circuit comprising:
    first and second fins each extending in a first direction;
    a first gate line extending longitudinally across the first and second fins in a second direction substantially perpendicular to the first direction; and
    a first contact jumper comprising a first conductive pattern crossing the first gate line above the first fin, and a second conductive pattern extending longitudinally in the second direction above the first gate line and connected to the first conductive pattern.

2. The integrated circuit of claim 1, wherein the first and second fins are spaced in the second direction such that a middle region exists as interposed between the first and second fins in the second direction, and the second conductive pattern extends over the middle region between the first and second fins, further comprising a via disposed on the second conductive pattern at a location over the middle region.

3. The integrated circuit of claim 1, wherein the first contact jumper further comprises a third conductive pattern crossing the first gate line above the second fin and connected to the second conductive pattern.

4. The integrated circuit of claim 1, further comprising a second contact jumper crossing the first gate line above the second fin and spaced apart from the first contact jumper.

5. The integrated circuit of claim 1, further comprising:
    at least one second gate line parallel to the first gate line; and
    a second contact jumper crossing the first gate line and the at least one second gate line above the second fin and spaced apart from the first contact jumper.

6. The integrated circuit of claim 1, further comprising:
    at least one second gate line parallel to the first gate line; and
    a second contact jumper crossing the first gate line above the second fin and spaced apart from the first contact jumper,
    wherein the first conductive pattern crosses the first gate line and the at least one second gate line.

7. The integrated circuit of claim 1, further comprising:
    first contacts on the first fin; and
    a first metal pattern extending in the first direction above the first fin and disposed above and electrically connecting the first contacts.

8. The integrated circuit of claim 1, wherein the first and second fins are spaced in the second direction such that a middle region exists as interposed between the first and second fins in the second direction, and the second conductive pattern extends over the middle region between the first and second fins, further comprising:
    a plurality of second gate lines parallel to the first gate line;
    a first via disposed on the second conductive pattern at a location over the middle region between the first and second fins;
    second vias on the plurality of second gate lines in the middle region; and
    metal patterns on the first via and the second vias and extending in the second direction.

9. The integrated circuit of claim 1, wherein the first conductive pattern comprises a first contact on the first fin, and the second conductive pattern comprises a second contact on the first gate line.

10. The integrated circuit of claim 1, further comprising first and second trench silicides on both sides of the first gate line in the first fin and extending in the second direction,
wherein the first conductive pattern comprises a first contact on the first and second trench silicides and the second conductive pattern comprises a second contact on the first gate line.

11. The integrated circuit of claim 1, further comprising first and second contacts on both sides of the first gate line in the first fin,
wherein the first conductive pattern is disposed on and electrically connects the first and second contacts and the second conductive pattern is electrically insulated from the first gate line.

12. An integrated circuit comprising:
first and second fins each extending in a first direction and spaced in a second direction substantially perpendicular to the first direction such that a middle region exists as interposed between the first and second fins in the second direction;
first and second gate lines spaced from each other in the first direction, each of the first and second gate lines extending longitudinally across the first and second fins and the middle region in the second direction;
a contact jumper comprising a first conductive pattern crossing the first gate line above the first fin and a second conductive pattern extending longitudinally in the second direction above the first gate line and connected to the first conductive pattern;
first and second vias aligned with each other in the first direction in the middle region between the first and second fins, wherein the first via is disposed on the second conductive pattern and the second via is located above the second gate line; and
a first metal layer comprising a first metal pattern extending in the first direction above the first fin, a second metal pattern extending in the first direction above the second fin, and a plurality of third metal patterns extending in the second direction in the middle region and respectively disposed on the first and second vias.

13. The integrated circuit of claim 12, wherein the contact jumper further comprises a third conductive pattern crossing the first and second gate lines above the second fin and connected to the second conductive pattern.

14. The integrated circuit of claim 13, wherein the third metal patterns have widths, in the first direction, that are substantially the same, and
the third metal patterns have lengths, in the second direction, that are substantially the same.

15. The integrated circuit of claim 13, further comprising:
third vias arranged on the third metal patterns, respectively; and
a second metal layer comprising fourth metal patterns disposed on the third vias, respectively, each of the fourth metal patterns extending longitudinally in the second direction,
wherein the fourth metal patterns have widths, in the first direction, that are substantially the same, and the fourth metal patterns have lengths, in the second direction, that are substantially the same.

16. A semiconductor device comprising:
a substrate having first and second fins each elongated in a first direction and spaced in a second direction substantially perpendicular to the first direction, and a middle region interposed between the first and second fins in the second direction;
gate lines spaced from each other in the first direction, each of the gate lines extending longitudinally across the first and second fins and the middle region in the second direction;
a layer of contacts on the substrate and having upper surfaces substantially coplanar at a level above the substrate,
the layer of contacts including a contact jumper comprising a first conductive pattern elongated in the first direction and crossing at least one of the gate lines in the first direction above the first fin of the substrate, and a second conductive pattern extending from the first conductive pattern longitudinally in the second direction over at least part of the middle region of the substrate;
a layer of vias on the layer of contacts, each of the vias extending on the upper surface of a respective one of the contacts, and the layer of vias including a plurality of vias disposed over the middle region of the substrate as aligned with each other in the first direction; and
a first metallization layer on the layer of vias,
wherein only one track of metal in the first metallization layer extends over the first fin, and
only one track of metal in the first metallization layer extends over the second fin, and
each of the tracks of metal extends across the gate lines in the first direction.

17. The semiconductor device of claim 16, wherein the first metallization layer includes a first metal pattern extending longitudinally in the first direction above the first fin of the substrate and constituting the track of metal extending over the first fin, a second metal pattern extending longitudinally in the first direction above the second fin and constituting the track of metal extending over the second fin, and third metal patterns each extending longitudinally in the second direction over the middle region of the substrate and each disposed on a respective one the plurality of vias.

18. The semiconductor device of claim 16, wherein the second conductive pattern of the contact jumper extends longitudinally in the second direction over one of the gate lines, and a first one of the plurality of vias is disposed on the second conductive pattern so as to be disposed on said one of the gate lines at a location over the middle region of the substrate.

19. The semiconductor device of claim 17, further comprising a second layer of vias on the first metallization layer, the vias of the second layer being disposed on the third metal patterns, respectively.

20. The semiconductor device of claim 19, further comprising a second metallization layer on the second layer of vias and comprising a plurality of discrete metal patterns disposed on the vias of the second layer, respectively.

* * * * *